United States Patent
Li et al.

(10) Patent No.: US 12,274,014 B2
(45) Date of Patent: Apr. 8, 2025

(54) ELECTRONIC DEVICE AND FOLDABLE ASSEMBLY

(71) Applicant: GUANGDONG OPPO MOBILE TELECOMMUNICATIONS CORP., LTD., Guangdong (CN)

(72) Inventors: Jie Li, Guangdong (CN); Zekuan Zheng, Guangdong (CN); Jiao Cheng, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 223 days.

(21) Appl. No.: 17/676,566

(22) Filed: Feb. 21, 2022

(65) Prior Publication Data

US 2022/0174830 A1  Jun. 2, 2022

Related U.S. Application Data

(63) Continuation of application No. PCT/CN2020/102109, filed on Jul. 15, 2020.

(30) Foreign Application Priority Data

Aug. 30, 2019  (CN) .......................... 201910826925.4

(51) Int. Cl.
  *H05K 5/00*   (2006.01)
  *F16C 11/04*  (2006.01)
  *H05K 5/02*   (2006.01)

(52) U.S. Cl.
  CPC ............ *H05K 5/0226* (2013.01); *F16C 11/04* (2013.01); *H05K 5/0017* (2013.01)

(58) Field of Classification Search
  None
  See application file for complete search history.

(56) References Cited

U.S. PATENT DOCUMENTS 9,557,771 B2 * 1/2017 Park ..................... H04M 1/0237
9,848,502 B1  12/2017 Chu et al.
(Continued)

FOREIGN PATENT DOCUMENTS

CN  101325848 A  12/2008
CN  202326679 U   7/2012
(Continued)

OTHER PUBLICATIONS

Extended European Search Report for EP Application 20859153.7 mailed Sep. 9, 2022. (9 pages).
(Continued)

*Primary Examiner* — Imani N Hayman
*Assistant Examiner* — Rashen E Morrison
(74) *Attorney, Agent, or Firm* — Young Basile Hanlon & MacFarlane, P.C.

(57) ABSTRACT

An electronic device and a foldable assembly are provided, the electronic device includes a first main body, a second main body, and a rotating shaft mechanism which includes a rotating shaft base, a first rotating member, a second rotating member, and a linkage assembly; and the linkage assembly includes a first linkage member and a second linkage member, the first linkage member and the second linkage member each have sliding blocks, the first rotating member and the second rotating member each have sliding portions in sliding fit with sliding blocks. The first rotating member further has a first main body portion, the first sliding portion is disposed at one side of the first main body portion, and the first sliding block is in sliding fit and rotating fit with a first sliding groove defined between the first sliding portion and the first main body portion.

16 Claims, 11 Drawing Sheets

(56) References Cited

U.S. PATENT DOCUMENTS

| | | |
|---|---|---|
| 10,036,188 B1 | 7/2018 | Yao et al. |
| 2003/0118179 A1 | 6/2003 | Barnett et al. |
| 2010/0048263 A1 | 2/2010 | Wang et al. |
| 2012/0044620 A1 | 2/2012 | Song et al. |
| 2012/0206896 A1 | 8/2012 | Suzuki et al. |
| 2014/0126121 A1 | 5/2014 | Griffin et al. |
| 2015/0233162 A1 | 8/2015 | Lee et al. |
| 2015/0257289 A1 | 9/2015 | Lee et al. |
| 2016/0295709 A1 | 10/2016 | Ahn |
| 2017/0138103 A1 | 5/2017 | Hong et al. |
| 2018/0192528 A1 | 7/2018 | Lin et al. |
| 2018/0347245 A1 | 12/2018 | Chu |

FOREIGN PATENT DOCUMENTS

| | | |
|---|---|---|
| CN | 205584268 U | 9/2016 |
| CN | 205858945 U | 1/2017 |
| CN | 206112430 U | 4/2017 |
| CN | 105370717 B | 7/2018 |
| CN | 108665809 A | 10/2018 |
| CN | 108922408 A | 11/2018 |
| CN | 108965500 A | 12/2018 |
| CN | 109792461 A | 5/2019 |
| CN | 110045788 A | 7/2019 |
| CN | 209070426 U | 7/2019 |
| CN | 111615277 A | 9/2020 |
| CN | 112112882 A | 12/2020 |
| KR | 101505457 B1 | 3/2015 |
| KR | 20150142290 A | 12/2015 |
| TW | I610531 B | 1/2018 |
| WO | 2018090789 A1 | 5/2018 |

OTHER PUBLICATIONS

Chinese First Office Action with English Translation for CN Application 202210160605.1, mailed Aug. 29, 2022. (18 pages).

Chinese First Office Action with English Translation issued in corresponding CN application No. 201910826925.4 dated Jun. 28, 2021.

International Search Report with English Translation issued in corresponding PCT/CN2020/102109 dated Oct. 15, 2020.

First examination report issued in corresponding IN application No. 202217009916 dated Jul. 13, 2022.

Japanese Notice of Reasons for Refusal with English Translation for JP Application 2022512868 mailed Apr. 4, 2023. (10 pages).

Extended European Search Report for EP Application 23205656.4 mailed Jan. 8, 2024. (9 pages).

India Hearing Notice issued in corresponding IN Application No. 202217009916 dated May 14, 2024, 3 pages.

Korea Notice of Preliminary Rejection and English translation issued in corresponding KR Application No. 10-2022-7007450 dated May 27, 2024, 14 pages.

Korea Notice of Allowance and English translation issued in corresponding KR application No. 10-2022-7007450, dated Jul. 31, 2024, 7 pages.

Chinese First Office Action with English translation for corresponding CN Patent Application No. 202210160603.2, issued on Nov. 13, 2024, 10 pages.

Chinese First Office Action for corresponding CN Patent Application No. 202210160604.7, issued on Nov. 25, 2024, 12 pages.

* cited by examiner

ELECTRONIC DEVICE AND FOLDABLE ASSEMBLY

CROSS-REFERENCE TO RELATED APPLICATION(S)

This application is a continuation application of International Application No. PCT/CN 2020/102109, filed on Jul. 15, 2020, which claims priority to Chinese Patent Application No. 201910826925.4, filed on Aug. 30, 2019, the entire disclosure of both of which are incorporated herein by reference.

TECHNICAL FIELD

This disclosure relates to the technical field of rotating shafts, and in particular to an electronic device and a foldable assembly.

BACKGROUND

At present, in order to realize a foldable structure of an electronic device, it is necessary to dispose a rotating shaft structure in the electronic device. The current rotating shaft structure is complex and a complex gear transmission mechanism is generally adopted therein, which has high requirements for manufacturing accuracy and assembly accuracy of components and parts, resulting in increased product costs.

SUMMARY

An electronic device is provided in implementations of the present disclosure, and the electronic device includes a first main body, a second main body, and a rotating shaft mechanism. The rotating shaft mechanism includes a rotating shaft base, a first rotating member, a second rotating member, and a linkage assembly. The first rotating member is connected with the first main body and the second rotating member is connected with the second main body. The linkage assembly includes a first linkage member and a second linkage member, and the first linkage member and the second linkage member are each rotatably connected with the rotating shaft base. The first linkage member has a first sliding block, the second linkage member has a second sliding block, the first rotating member has a first sliding portion in sliding fit with the first sliding block, and the second rotating member has a second sliding portion in sliding fit with the second sliding block. The first rotating member further has a first main body portion fixedly connected with the first sliding portion, the first sliding portion is disposed at one side of the first main body portion, a first sliding groove is defined between the first sliding portion and the first main body portion, and the first sliding block is in sliding fit and rotating fit with the first sliding groove.

Another electronic device is further provided in implementations of the present disclosure, and the electronic device includes a first housing, a second housing, a rotating shaft mechanism, and a flexible display screen. The rotating shaft mechanism includes a rotating shaft base, a first rotating member, a second rotating member, and a linkage assembly. The first rotating member is connected with the first housing and the second rotating member is connected with the second housing. The linkage assembly includes a first linkage member and a second linkage member, and the first linkage member and the second linkage member are each rotatably connected with the rotating shaft base. The first linkage member has a first sliding block, the second linkage member has a second sliding block, the first rotating member has a first sliding portion in sliding fit with the first sliding block, and the second rotating member has a second sliding portion in sliding fit with the second sliding block. The flexible display screen has a first display portion, a second display portion arranged opposite to the first display portion, and a bendable display portion fixedly connected with the first display portion and the second display portion. The first display portion is fixed to the first housing, the second display portion is fixed to the second housing, and the first housing is configured to rotate relative to the second housing through the rotating shaft mechanism to drive the bendable display portion to bend. The first rotating member further has a first main body portion connected with the first sliding portion, the first sliding portion is disposed at one side of the first main body portion, and the first sliding portion is rotatably and slidingly connected with the first sliding block.

A foldable assembly is further provided in implementations of the present disclosure, and the foldable assembly includes a first housing, a second housing, and a rotating shaft mechanism. The rotating shaft mechanism includes a rotating shaft base, a first rotating member, a second rotating member, and a linkage assembly. The first rotating member is connected with the first housing and the second rotating member is connected with the second housing. The linkage assembly includes a first linkage member and a second linkage member, and the first linkage member and the second linkage member are each rotatably connected with the rotating shaft base. The first linkage member has a first sliding block, the second linkage member has a second sliding block, the first rotating member has a first sliding portion in sliding fit with the first sliding block, and the second rotating member has a second sliding portion in sliding fit with the second sliding block. The first rotating member further has a first main body portion fixedly connected with the first sliding portion, the first sliding portion is disposed at one side of the first main body portion, a first sliding groove is defined between the first sliding portion and the first main body portion, and the first sliding block is in sliding fit and rotating fit with the first sliding groove.

BRIEF DESCRIPTION OF DRAWINGS

In order to describe technical solutions of implementations of the present disclosure more clearly, the following will give a brief introduction to the accompanying drawings used for describing the implementations. Apparently, the accompanying drawings hereinafter described are merely some implementations of the present disclosure. Based on these drawings, those of ordinary skill in the art can also obtain other drawings without creative effort.

DETAILED DESCRIPTION

Figure 1:
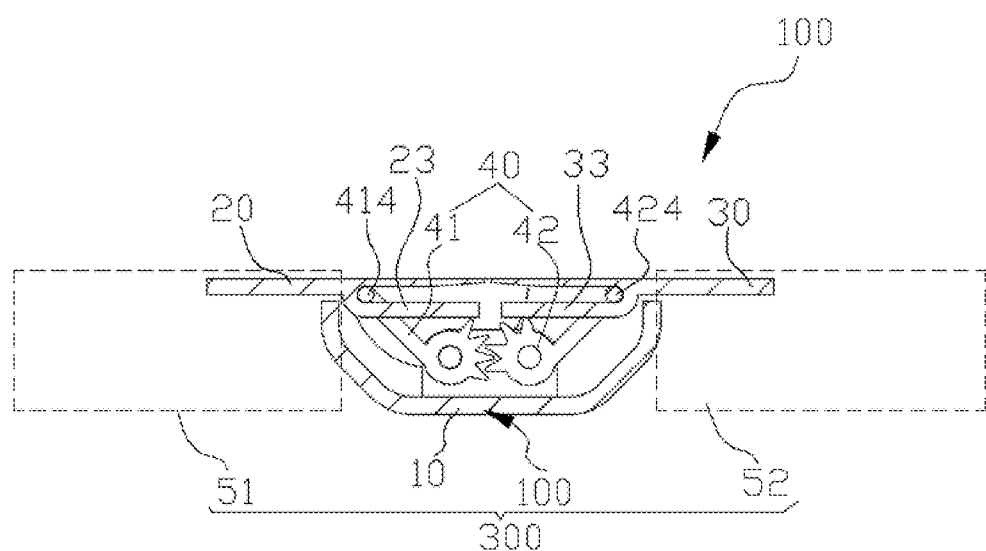
FIG. 1 is a schematic structural view illustrating a rotating shaft mechanism of an electronic device provided in implementations of the present disclosure.

An electronic device is provided in implementations of the present disclosure, and the electronic device includes a first main body, a second main body, and a rotating shaft mechanism. The rotating shaft mechanism includes a rotating shaft base, a first rotating member, a second rotating member, and a linkage assembly. The first rotating member is connected with the first main body and the second rotating member is connected with the second main body. The linkage assembly includes a first linkage member and a second linkage member, and the first linkage member and the second linkage member are each rotatably connected with the rotating shaft base. The first linkage member has a first sliding block, the second linkage member has a second sliding block, the first rotating member has a first sliding portion in sliding fit with the first sliding block, and the second rotating member has a second sliding portion in sliding fit with the second sliding block. The first rotating member further has a first main body portion fixedly connected with the first sliding portion, the first sliding portion is disposed at one side of the first main body portion, a first sliding groove is defined between the first sliding portion and the first main body portion, and the first sliding block is in sliding fit and rotating fit with the first sliding groove.

In an implementation, the rotating shaft base has two side plates arranged opposite to each other and a bottom plate fixedly connected with the two side plates, the two side plates and the bottom plate define an accommodating groove, and the rotating shaft base further has a first bracket, a second bracket, and a third bracket which are each located in the accommodating groove.

In an implementation, the first linkage member has a first rotating shaft and a first push rod fixedly connected with the first rotating shaft, the first rotating shaft is rotatably connected with the rotating shaft base, a rotation axis-line of the first rotating shaft is parallel to a rotation axis-line of the first rotating member, and the first sliding block is disposed at an end of the first push rod away from the first rotating shaft.

In an implementation, the second linkage member has a second rotating shaft and a second push rod fixedly connected with the second rotating shaft, the second rotating shaft is rotatably connected with the rotating shaft base, a rotation axis-line of the second rotating shaft is parallel to a rotation axis-line of the second rotating member, the second rotating shaft and the first rotating shaft are linked with each other, and the second sliding block is disposed at an end of the second push rod away from the second rotating shaft.

In an implementation, the rotating shaft base defines an accommodating groove, the first rotating shaft and the second rotating shaft are each received in the accommodating groove, a plane defined by the rotation axis-line of the first rotating member and the rotation axis-line of second rotating member is located at a side of the first rotating shaft and the second rotating shaft away from bottom of the accommodating groove.

In an implementation, the accommodating groove has an opening and a bottom surface opposite to the opening; a distance between a plane defined by the rotation axis-line of the first rotating shaft and a rotation axis-line of the second rotating shaft and the bottom surface is a first distance, a distance between a plane defined by the rotation axis-line of the first rotating member and a rotation axis-line of the second rotating member and the bottom surface is a second distance, and the first distance is less than the second distance.

In an implementation, a distance between the rotation axis-line of the first rotating shaft and a rotation axis-line of the second rotating shaft is less than a distance between the rotation axis-line of the first rotating member and a rotation axis-line of the second rotating member.

In an implementation, a direction in which the second sliding block is opposite to the first sliding block is parallel to a plane defined by a rotation axis-line of the first rotating member and a rotation axis-line of the second rotating member.

In an implementation, a sliding direction of the first sliding block relative to the first rotating member is perpendicular to a direction of the rotation axis-line of the first rotating member.

In an implementation, the first rotating member has a first rotating portion fixedly connected with the first main body portion.

In an implementation, the first main body portion has a first rotating end and a first connecting end opposite to the first rotating end, the first rotating portion is disposed at the first rotating end, and in a direction perpendicular to the sliding direction of the first sliding block relative to the first rotating member, the size of the first sliding groove close to the first rotating end is greater than that of the first sliding groove close to the first connecting end.

In an implementation, the first rotating member has a first rotating portion, the first rotating portion is rotatably connected with the rotating shaft base, the first rotating portion and the first sliding portion are arranged side by side in a direction of a rotation axis-line of the first linkage member, the first linkage member is at least partially overlapped with the first sliding portion and at least partially overlapped with the first rotating portion.

In an implementation, the second rotating member has a second rotating portion, the second rotating portion is rotatably connected with the rotating shaft base, the second rotating portion and the second sliding portion are arranged side by side in a direction of rotation axis-line of the second linkage member, the second linkage member is at least partially overlapped with the second sliding portion and at least partially overlapped with the second rotating portion.

In an implementation, the rotating shaft base has a first end and a second end opposite to the first end, the first rotating portion is located at a side of the first linkage member adjacent to the first end, the second rotating portion is located at a side of the second linkage member adjacent to the second end, and the first rotating portion is at least partially overlapped with the second rotating portion when the first main body and the second main body are unfolded.

In an implementation, the first rotating portion has a first connecting structure extending in an arc, the first rotating portion is rotatably connected with the rotating shaft base through the first connecting structure, the second rotating portion has a second connecting structure extending in an arc, the second rotating portion is rotatably connected with the rotating shaft base through the second connecting structure, and a distance between a rotation axis-line of the first rotating portion and a rotation axis-line of the second rotating portion is less than a sum of a radius of the first connecting structure and a radius of the second connecting structure.

Another electronic device is further provided in implementations of the present disclosure. The electronic device includes a first housing, a second housing, a rotating shaft mechanism, and a flexible display screen. The rotating shaft mechanism includes a rotating shaft base, a first rotating member, a second rotating member, and a linkage assembly, and the first rotating member is connected with the first housing and the second rotating member is connected with the second housing. The linkage assembly includes a first linkage member and a second linkage member, and the first linkage member and the second linkage member are each rotatably connected with the rotating shaft base. The first linkage member has a first sliding block, the second linkage member has a second sliding block, the first rotating member has a first sliding portion in sliding fit with the first sliding block, and the second rotating member has a second sliding portion in sliding fit with the second sliding block. The flexible display screen has a first display portion, a second display portion arranged opposite to the first display portion, and a bendable display portion fixedly connected with the first display portion and the second display portion. The first display portion is fixed to the first housing, the second display portion is fixed to the second housing, and the first housing is configured to rotate relative to the second housing through the rotating shaft mechanism to drive the bendable display portion to bend. The first rotating member further has a first main body portion connected with the first sliding portion, the first sliding portion is disposed at one side of the first main body portion, and the first sliding portion is rotatably and slidingly connected with the first sliding block.

In an implementation, the first linkage member has a first rotating shaft and a first push rod fixedly connected with the first rotating shaft, the first rotating shaft is rotatably connected with the rotating shaft base, a rotation axis-line of the first rotating shaft is parallel to a rotation axis-line of the first rotating member, and the first sliding block is disposed at an end of the first push rod away from the first rotating shaft.

In an implementation, the second linkage member has a second rotating shaft and a second push rod fixedly connected with the second rotating shaft, the second rotating shaft is rotatably connected with the rotating shaft base, a rotation axis-line of the second rotating shaft is parallel to a rotation axis-line of the second rotating member, the second rotating shaft and the first rotating shaft are linked with each other, and the second sliding block is disposed at an end of the second push rod away from the second rotating shaft.

In an implementation, the first rotating member has a first rotating portion, the first rotating portion is rotatably connected with the rotating shaft base, the first rotating portion and the first sliding portion are arranged side by side in a direction of a rotation axis-line of the first linkage member, and the first linkage member is at least partially overlapped with the first sliding portion and at least partially overlapped with the first rotating portion.

In an implementation, the second rotating member has a second rotating portion, the second rotating portion is rotatably connected with the rotating shaft base, the second rotating portion and the second sliding portion are arranged side by side in a direction of a rotation axis-line of the second linkage member, and the second linkage member is at least partially overlapped with the second sliding portion and at least partially overlapped with the second rotating portion.

In an implementation, the first rotating member further has a first rotating portion, the first main body portion and the first sliding portion constitutes a first baffle plate, and the first baffle plate is fixedly connected with the first rotating portion; and the first baffle plate defines a first sliding groove, the first baffle plate is in rotating fit and sliding fit with the first sliding block through the first sliding groove.

In an implementation, the first main body portion has a first rotating end and a first connecting end opposite to the first rotating end, the first rotating end is close to the rotating shaft base relative to the first connecting end, and in a direction perpendicular to a plane defined by a rotation axis-line of the first rotating member and a rotation axis-line of the second rotating member, an opening size of the first sliding groove close to the first rotating end is greater than that of the first sliding groove close to the first connecting end.

A foldable assembly is further provided in implementations of the present disclosure, the foldable assembly includes a first housing, a second housing, and a rotating shaft mechanism. The rotating shaft mechanism includes a rotating shaft base, a first rotating member, a second rotating member, and a linkage assembly, and the first rotating member is connected with the first housing and the second rotating member is connected with the second housing. The linkage assembly includes a first linkage member and a second linkage member, and the first linkage member and the second linkage member are each rotatably connected with the rotating shaft base. The first linkage member has a first sliding block, the second linkage member has a second sliding block, the first rotating member has a first sliding portion in sliding fit with the first sliding block, and the second rotating member has a second sliding portion in sliding fit with the second sliding block. The first rotating member further has a first main body portion fixedly connected with the first sliding portion, the first sliding portion is disposed at one side of the first main body portion, a first sliding groove is defined between the first sliding portion and the first main body portion, and the first sliding block is in sliding fit and rotating fit with the first sliding groove.

In an implementation, the first rotating member has a first rotating portion, the first rotating portion is rotatably connected with the rotating shaft base, the first rotating portion and the first sliding portion are arranged side by side in a direction of a rotation axis-line of the first linkage member, and the first linkage member is at least partially overlapped with the first sliding portion and at least partially overlapped with the first rotating portion; and the second rotating member has a second rotating portion, the second rotating portion is rotatably connected with the rotating shaft base, the second rotating portion and the second sliding portion are arranged side by side in a direction of a rotation axis-line of the second linkage member, and the second linkage member is at least partially overlapped with the second sliding portion and at least partially overlapped with the second rotating portion.

Figure 2:
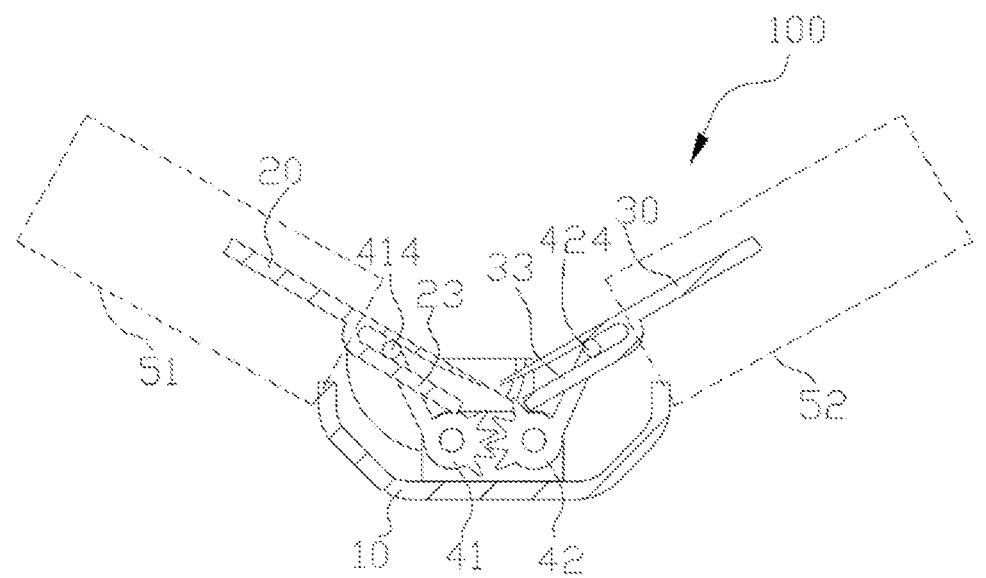
FIG. 2 is a schematic structural view illustrating a rotating shaft mechanism of an electronic device provided in other implementations of the present disclosure.
Figure 3:
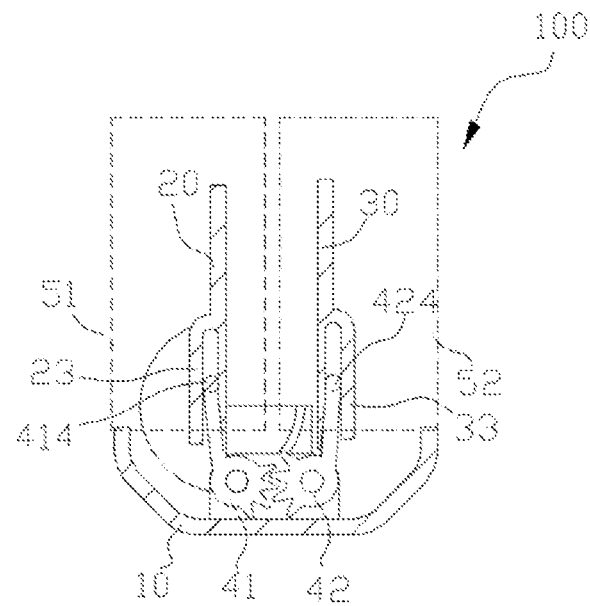
FIG. 3 is a schematic structural view illustrating a rotating shaft mechanism of an electronic device provided in other implementations of the present disclosure.

Referring to FIG. 1, FIG. 2, and FIG. 3, a rotating shaft mechanism 100 is provided in implementations of the present disclosure, the rotating shaft mechanism 100 is applicable to an electronic device 300, and the electronic device 300 includes a first main body 51 and a second main body 52. The rotating shaft mechanism 100 includes a rotating shaft base 10, a first rotating member 20, a second rotating member 30, and a linkage assembly 40. The first rotating member 20 and the second rotating member 30 are each rotatably connected with the rotating shaft base 10, and the first rotating member 20 is connected with the first main body 51 and the second rotating member 30 is connected with the second main body 52 to drive the first main body 51 and the second main body 52 to unfold or fold relative to each other. The linkage assembly 40 includes a first linkage member 41 and a second linkage member 42, the first linkage member 41 and the second linkage member 42 are each rotatably connected with the rotating shaft base 10, and the first linkage member 41 and the second linkage member 42 are linked with each other. The first linkage member 41 has a first sliding block 414, the second linkage member 42 has a second sliding block 424, the first rotating member 20 has a first sliding portion 23 in sliding fit with the first sliding block 414, and the second rotating member 30 has a second sliding portion 33 in sliding fit with the second sliding block 424. The first rotating member 20 is configured to rotate relative to the rotating shaft base 10 to drive the first sliding block 414 to slide relative to the first rotating member 20 and rotate relative to the rotating shaft base 10 along with the first rotating member 20, and the second rotating member 30 is configured to rotate relative to the rotating shaft base 10 to drive the second sliding block 424 to slide relative to the second rotating member 30 and rotate relative to the rotating shaft base 10 to along with the second rotating member 30, to make the first rotating member 20 rotate synchronously with the second rotating member 30 through the linkage assembly 40.

In related art, a complex gear transmission mechanism is usually adopted to realize synchronous rotation of dual shafts, but requirements for manufacturing accuracy and assembly accuracy of gears are very high. Inevitably, when multiple gears are used for transmission, a center distance tolerance between adjacent gears leads to lost motion in transmission of adjacent gears. For a multi-gear mechanism, greater accumulated lost motion errors will lead to more difficulty in achieving a synchronous transmission effect with high accuracy.

The first linkage member 41 and the second linkage member 42 are each rotatably connected with the rotating shaft base 10, the first rotating member 20 has the first sliding portion 23 in sliding fit with the first sliding block 414, the second rotating member 30 has the second sliding portion 33 in sliding fit with the second sliding block 424, and the first rotating member 20 can rotate synchronously with the second rotating member 30 through the linkage assembly 40, that is, the first linkage member 41 is linked with the second linkage member 42. The first rotating member 20 can transmit twisting force to the second rotating member 30 through the first linkage member 41 and the second linkage member 42, and vice versa, the second rotating member 30 can also transmit twisting force to the first rotating member 20 through the first linkage member 41 and the second linkage member 42, thereby achieving synchronous rotation of the first rotating member 20 and the second rotating member 30 and avoiding adopting a complex gear structure, which can reduce assembly errors, improve transmission accuracy, and reduce product costs.

When the first rotating member 20 rotates relative to the rotating shaft base 10, the first rotating member 20 can drive the first linkage member 41 to rotate relative to the rotating shaft base 10 through fit of the first sliding block 414 and the first sliding portion 23, and a rotation axis-line of the first rotating member 20 is parallel to a rotation axis-line of the first linkage member 41. The first rotating member 20 can transmit rotating twisting force to the first sliding block 414, to make the first sliding block 414 slide relative to the first sliding portion 23 while rotating relative to the rotating shaft base 10 along with the first rotating member 20, thus driving the first linkage member 41 to rotate relative to the rotating shaft base 10 around a direction parallel to the rotation axis-line of the first rotating member 20, thereby achieving that the first rotating member 20 and the first linkage member 41 move synchronously around different independent rotating axes, an assembly error is small, and synchronization movement accuracy is high.

When the second rotating member 30 rotates relative to the rotating shaft base 10, the second rotating member 30 can drive the second linkage member 42 to rotate relative to the rotating shaft base 10 through fit of the second sliding block 424 and the second sliding portion 33, and a rotation axis-line of the second rotating member 30 is parallel to a rotation axis-line of second linkage member 42. The second rotating member 30 can transmit rotating twisting force to the second sliding block 424, to make the second sliding block 424 slide relative to the second sliding portion 33 while rotating relative to the rotating shaft base 10 along with the second rotating member 30 to, thus driving the second linkage member 42 to rotate relative to the rotating shaft base 10 around a direction parallel to the rotation axis-line of the second rotating member 30, thereby achieving that the second rotating member 30 and the second linkage member 42 move synchronously around different independent rotating axes, an assembly error is small, and synchronization movement accuracy is high. In addition, the first linkage member 41 is linked with the second linkage member 42, thereby achieving synchronous rotation of the first rotating member 20 and the second rotating member 30, reducing an assembly error, improving synchronization movement accuracy, and reducing costs.

It can be understood that, the electronic device 300 may be a smart phone, a tablet computer, a smart watch, a notebook computer, or a wearable device, etc. The electronic device 300 has a foldable structure, the first main body 51 can rotate relative to the second main body 52 through the rotating shaft mechanism 100, such that the first main body 51 is folded or unfolded relative to the second main body 52 to realize two states of use. The first rotating member 20 and the second rotating member 30 can synchronously rotate relative to the rotating shaft base 10 through the linkage assembly 40, as such the first main body 51 and the second main body 52 can synchronously rotate relative to the rotating shaft base 10, which makes rotating twisting forces of the first main body 51 and the second main body 52 balanced to meet rotating twisting force requirements for various angles.

Figure 4:
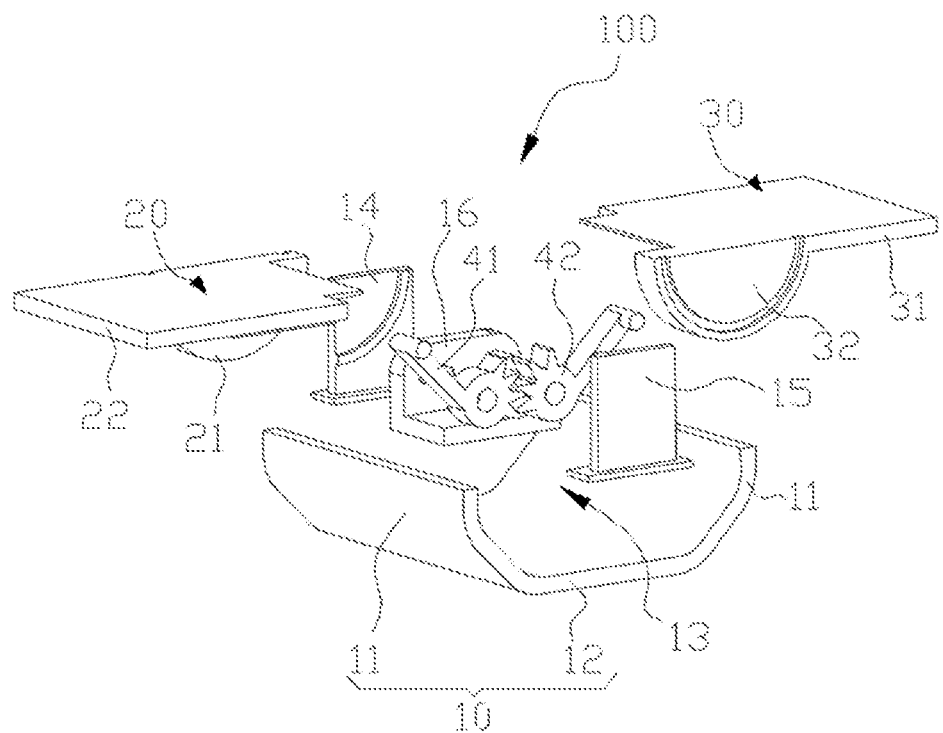
FIG. 4 is a schematic structural view illustrating a rotating shaft mechanism of an electronic device provided in other implementations of the present disclosure.
Figure 5:
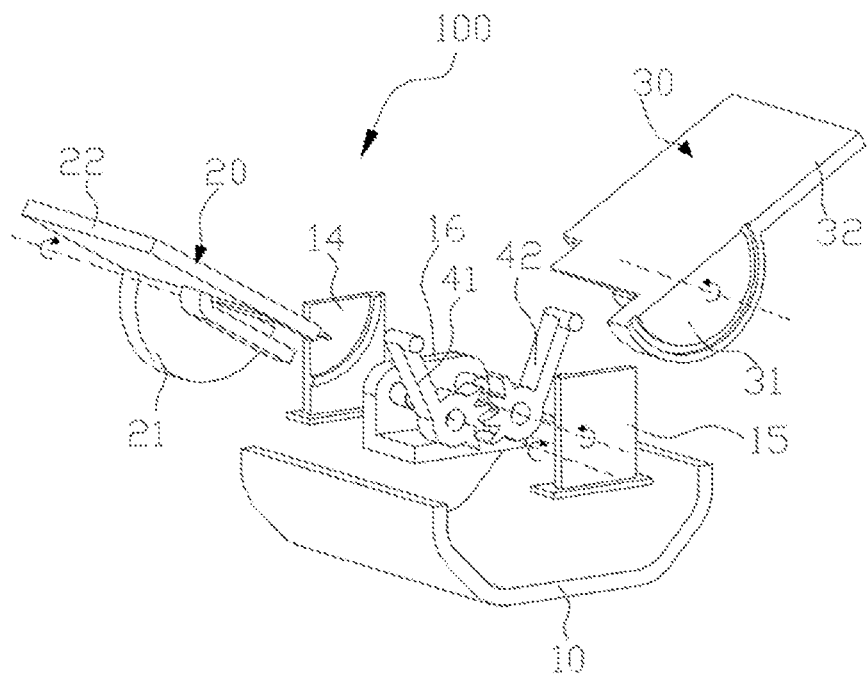
FIG. 5 is a schematic structural view illustrating a rotating shaft mechanism of an electronic device provided in other implementations of the present disclosure.

Referring to FIG. 4 and FIG. 5, in this implementation, the rotating shaft base 10 has two side plates 11 arranged opposite to each other and a bottom plate 12 fixedly connected with the two side plates 11. The two side plates 11 and the bottom plate 12 define an accommodating groove 13. The accommodating groove 13 is configured to provide mounting space and motion space for the first rotating member 20, the second rotating member 30, the first linkage member 41, and the second linkage member 42. The rotating shaft base 10 further has a first bracket 14, a second bracket 15, and a third bracket 16. The first bracket 14, the second bracket 15, and the third bracket 16 are each located in the accommodating groove 13. The first bracket 14, the second bracket 15, and the third bracket 16 can be fixedly connected with the bottom plate 12 through screw connection, welding, or glue bonding, etc., which can be disposed according to own needs and is not limited here. The first bracket 14 is configured to be rotatably connected with the first rotating member 20, the second bracket 15 is configured to be rotatably connected with the second rotating member 30, and the third bracket 16 is configured to be rotatably connected with the first linkage member 41 and the second linkage member 42.

Referring to FIG. 4 and FIG. 5, the first rotating member 20 has a first rotating portion 21 and a first baffle plate 22 fixedly connected with the first rotating portion 21. The first rotating member 20 is rotatably connected with the rotating shaft base 10 through the first rotating portion 21, where the first rotating portion 21 is rotatably connected with the first bracket 14. The first baffle plate 22 is flat-plate shaped, one end of the first baffle plate 22 is adjacent to the rotating shaft base 10, and the other end of the first baffle plate 22 extends in a direction away from the rotating shaft base 10. The first rotating portion 21 is fixed to the end of the first baffle plate 22 adjacent to the rotating shaft base 10. The first rotating portion 21 is a side plate fixed to a side edge of the first baffle plate 22. The first baffle plate 22 can rotate relative to the rotating shaft base 10 along with the first rotating portion 21. The second rotating member 30 has a second rotating portion 31 and a second baffle plate 32 fixedly connected with the second rotating portion 31. The second rotating member 30 is rotatably connected with the rotating shaft base 10 through the second rotating portion 31, and a direction of the rotation axis-line of the second rotating member 30 is parallel to a direction of the rotation axis-line of the first rotating member 20, where the second rotating portion 31 is rotatably connected with the second bracket 15. the second baffle plate 32 is flat-plate shaped, one end of the second baffle plate 32 is adjacent to the rotating shaft base 10, and the other end of the second baffle plate 32 extends in a direction away from the rotating shaft base 10. The second rotating portion 31 is fixed to one end of the second baffle plate 32 adjacent to the rotating shaft base 10. The second rotating portion 31 is a side plate fixed to a side edge of the second baffle plate 32. The second baffle plate 32 can rotate relative to the rotating shaft base 10 along with the second rotating portion 31, thereby achieving that the second baffle plate 32 rotates relative to the rotating shaft base 10 to unfold or fold relative to the first baffle plate 22. The first baffle plate 22 is configured to be connected with the first main body 51 and the second baffle plate 32 is configured to be connected with the second main body 52 to drive the first main body 51 and the second main body 52 to unfold or fold relative to each other.

Figure 6:
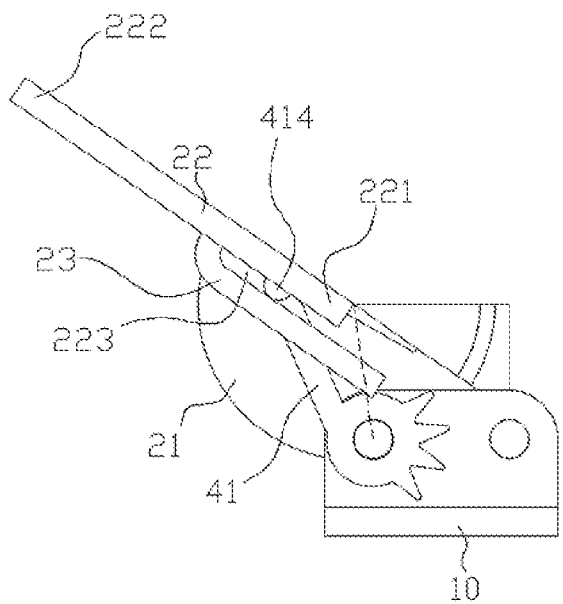
FIG. 6 is a schematic structural view illustrating a rotating shaft mechanism of an electronic device provided in other implementations of the present disclosure.

Referring to FIG. 5 and FIG. 6, the first linkage member 41 is in long-arm shape. One end of the first linkage member 41 is rotatably connected with the rotating shaft base 10, and the other end of the first linkage member 41 is connected with the first baffle plate 22. A rotation axis-line of the first linkage member 41 is parallel to the rotation axis-line of the first rotating member 20. The length of the first linkage member 41 is greater than a distance between the rotation axis-line of first linkage member 41 and the rotation axis-line of the first rotating member 20. The first baffle plate 22 has a first rotating end 221 and a first connecting end 222 opposite to the first rotating end 221. The first rotating portion 21 is disposed at the first rotating end 221. The first connecting end 222 is configured to be connected with the first main body 51. When the first baffle plate 22 rotates relative to the rotating shaft base 10 along with the first rotating portion 21, one end of the first linkage member 41 can be driven to rotate relative to the rotating shaft base 10, and the other end of the first linkage member 41 can be driven to rotate and slide relative to the first baffle plate 22. When the first baffle plate 22 and the second baffle plate 32 rotate relative to the rotating shaft base 10 away from each other, one end of the first linkage member 41 which is connected with the first baffle plate 22 slides close to the first connecting end 222 and rotates relative to the first baffle plate 22, to drive the first linkage member 41 to rotate relative to the rotating shaft base 10. When the first baffle plate 22 and the second baffle plate 32 rotate relative to the rotating shaft base 10 close to each other, the end of the first linkage member 41 which is connected with the first baffle plate 22 slides close to the first rotating end 221 and rotates relative to the first baffle plate 22, to drive the first linkage member 41 to rotate relative to the rotating shaft base 10.

Referring to FIG. 5 and FIG. 6, the first baffle plate 22 defines a first sliding groove 223, and the first baffle plate 22 is in rotating fit and sliding fit with the first linkage member 41 through the first sliding groove 223. The first sliding groove 223 extends from the first rotating end 221 toward the first connecting end 222. The first sliding groove 223 may extend along a straight line or a curve, which can be defined according to actual needs. Of course, in other implementations, the first sliding groove 223 may be defined on the first linkage member 41, and the first baffle plate 22 has a sliding block in sliding fit with the first sliding groove 223.

Figure 7:
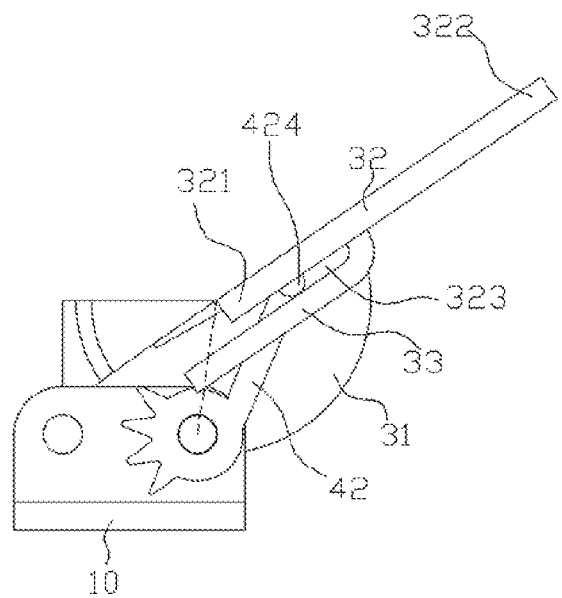
FIG. 7 is a schematic structural view illustrating a rotating shaft mechanism of an electronic device provided in other implementations of the present disclosure.

Referring to FIG. 5 and FIG. 7, the second linkage member 42 is in long-arm shape. One end of the second linkage member 42 is rotatably connected with the rotating shaft base 10, the other end of the second linkage member 42 is connected with the second baffle plate 32. A rotation axis-line of the second linkage member 42 is parallel to the rotation axis-line of the second rotating member 30. The length of the second linkage member 42 is greater than a distance between the rotation axis-line of the second linkage member 42 and the rotation axis-line of the second rotating member 30. The second baffle plate 32 has a second rotating end 321 and a second connecting end 322 opposite to the second rotating end 321. The second rotating portion 31 is disposed at the second rotating end 321. The second connecting end 322 is configured to be connected with the second main body 52. When the second baffle plate 32 rotates relative to the rotating shaft base 10 along with the second rotating portion 31, one end of the second linkage member 42 can be can be driven to rotate relative to the rotating shaft base 10, and the other end of the second linkage member 42 can be driven to rotate and slide relative to the second baffle plate 32. When the first baffle plate 22 and the second baffle plate 32 rotate relative to the rotating shaft base 10 away from each other, one end of the second linkage member 42 which is connected with the second baffle plate 32 slides close to the second connecting end 322 and rotates relative to the second baffle plate 32, to drive the second linkage member 42 to rotate relative to the rotating shaft base 10. When the first baffle plate 22 and the second baffle plate 32 rotate relative to the rotating shaft base 10 close to each other, the end of the second linkage member 42 which is connected with the second baffle plate 32 slides close to the second rotating end 321 and rotates relative to the second baffle plate 32, to drive the second linkage member 42 to rotate relative to the rotating shaft base 10.

Referring to FIG. 5 and FIG. 7, the second baffle plate 32 defines a second sliding groove 323, and the second baffle plate 32 is in rotating fit and sliding fit with the second linkage member 42 through the second sliding groove 323. The second sliding groove 323 extends from the second rotating end 321 toward the second connecting end 322. The second sliding groove 323 may extend along a straight line or a curve, which can be defined according to actual needs. Of course, in other implementations, the second sliding groove 323 may be defined on the second linkage member 42, and the second baffle plate 32 has a sliding block in sliding fit with the second sliding groove 323.

Figure 8:
FIG. 8 is a schematic structural view illustrating a rotating shaft mechanism of an electronic device provided in other implementations of the present disclosure.

Referring to FIG. 8, the first linkage member 41 has a first meshing portion 411 at an end of the first linkage member 41 adjacent to the second linkage member 42. The second linkage member 42 has a second meshing portion 421 at an end of the second linkage member 42 adjacent to the first linkage member 41. The second meshing portion 421 is meshed with the first meshing portion 411, so as to realize linkage of the first linkage member 41 and the second linkage member 42. The first meshing portion 411 and the second meshing portion 421 each have gear structures. The first meshing portion 411 may have an incomplete gear structure, that is, the first meshing portion 411 has meshing teeth at a partial peripheral edge. The second meshing portion 421 may have an incomplete gear structure, that is, the second meshing portion 421 has meshing teeth at a partial peripheral edge. Of course, the first meshing portion 411 and the second meshing portion 421 each may have a complete gear structure. In other implementations, the linkage of the first linkage member 41 and the second linkage member 42 may be achieved in other ways, for example, a driving belt may be disposed to link the first linkage member 41 and the second linkage member 42, which can be disposed according to actual needs and is not limited here.

Figure 9:
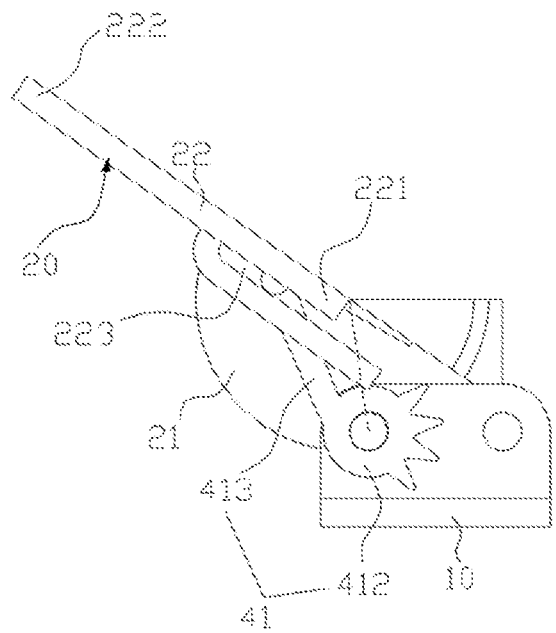
FIG. 9 is a schematic structural view illustrating a rotating shaft mechanism of an electronic device provided in other implementations of the present disclosure.

Referring to FIG. 1 and FIG. 9, furthermore, the first linkage member 41 has a first rotating shaft 412 and a first push rod 413 fixedly connected with the first rotating shaft 412. The first rotating shaft 412 is rotatably connected with the rotating shaft base 10, the first rotating shaft 412 is parallel to the rotation axis-line of the first rotating member 20, and the first sliding block 414 is disposed at an end of the first push rod 413 away from the first rotating shaft 412.

In this implementation, a length direction of the first push rod 413 is perpendicular to a rotation axis-line of the first rotating shaft 412. One end of the first push rod 413 is fixedly connected with the first rotating shaft 412. References of a connection manner of the first push rod 413 and the first rotating member 20 can be made to foregoing descriptions and will not be repeated herein. The length of the first push rod 413 is greater than a distance between the rotation axis-line of the first rotating shaft 412 and the rotation axis-line of the first rotating member 20, and when the first rotating member 20 rotates relative to the rotating shaft base 10, one end of the first push rod 413 can be driven to slide between the first rotating end 221 and the first connecting end 222, and the first rotating shaft 412 is driven to rotate through the first push rod 413, to be linked with the second linkage member 42 to drive the second rotating member 30 to rotate synchronously. Since the first linkage member 41 has a composite structure of a rotating shaft and a push rod, and the first push rod 413 has a relatively great length, that is, the first push rod 413 can play a role of a labor-saving lever, which can reduce a rotating torque, reduce a rotating resistance, and prolong a service life of the rotating shaft.

Figure 10:
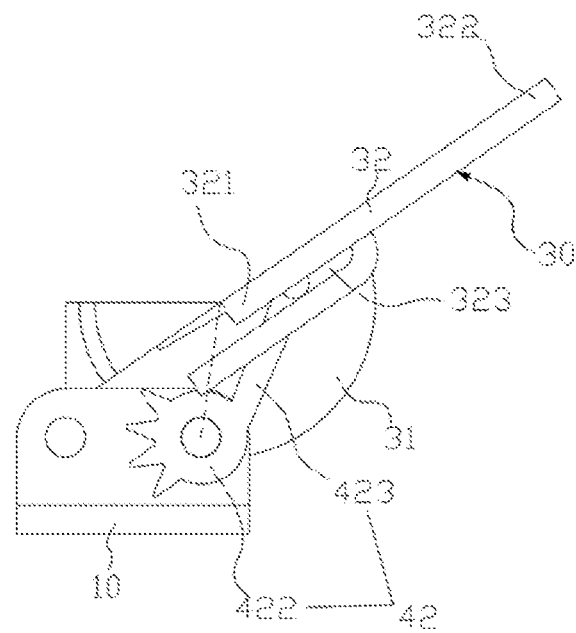
FIG. 10 is a schematic structural view illustrating a rotating shaft mechanism of an electronic device provided in other implementations of the present disclosure.

Referring to FIG. 1 and FIG. 10, furthermore, the second linkage member 42 has a second rotating shaft 422 and a second push rod 423 fixedly connected with the second rotating shaft 422. The second rotating shaft 422 is rotatably connected with the rotating shaft base 10, the second rotating shaft 422 is parallel to the rotation axis-line of the second rotating member 30, the second rotating shaft 422 is linked with the first rotating shaft 412, and the second sliding block 424 is disposed at an end of the second push rod 423 away from the second rotating shaft 422.

In this implementation, a length direction of the second push rod 423 is perpendicular to the rotation axis-line of the second rotating shaft 422. One end of the second push rod 423 is fixedly connected with the second rotating shaft 422. References of a connection manner of the second push rod 423 and the second rotating member 30 can be made to foregoing descriptions and will not be repeated herein. The length of the second push rod 423 is greater than a distance between the rotation axis-line of the second rotating shaft 422 and the rotation axis-line of the second rotating member 30, and when the second rotating member 30 rotates relative to the rotating shaft base 10, one end of the second push rod 423 can be driven to slide between the second rotating end 321 and the second connecting end 322, and the second rotating shaft 422 is driven to rotate through the second push rod 423, to be linked with the first linkage member 41 to drive the first rotating member 20 to rotate synchronously. Since the second linkage member 42 has a composite structure of a rotating shaft and a push rod, and the second push rod 423 has a relatively great length, that is, the second push rod 423 can play a role of a labor-saving lever, which can reduce a rotating torque, reduce a rotating resistance, and prolong a service life of the rotating shaft.

The first rotating shaft 412 may have meshing teeth which form a gear structure, the second rotating shaft 422 may have meshing teeth which form a gear structure, and the first rotating shaft 412 can be linked with the second rotating shaft 422 by meshing. The first rotating shaft 412 and the second rotating shaft 422 are each micro rotating shafts, the size of the first rotating shaft 412 is smaller than that of the first rotating portion 21, and the size of the second rotating shaft 422 is smaller than that of the second rotating portion 31, such that the first rotating shaft 412 and the second rotating shaft 422 occupy smaller arrangement space than the first rotating portion 21 and the second rotating portion 31. The first push rod 413 and the second push rod 423 each have long-arm structures, connected with back sides of the first baffle plate 22 and the second baffle plate 32, and occupy a small inner space of the rotating shaft base 10, such that the linkage assembly 40 has a small overall size and is suitable to be disposed in the rotating shaft base 10 with a small size, which is beneficial to realizing a small size of a rotating shaft mechanism. By driving the first rotating shaft 412 and the second rotating shaft 422 to rotate synchronously through the long-arm shaped first push rod 413 and the long-arm shaped second push rod 423 respectively, synchronous rotating torques of the first rotating member 20 and the second rotating member 30 are kept at a small level; in addition, in this implementation, the first push rod 413 and the second push rod 423 can meet a requirement for a large-space transmission, there is no need to dispose a complicated multi-gear transmission structure, and the first push rod 413 and the second push rod 423 have simple structures and have a small accumulated lost motion error, which can meet a transmission requirement for high precision.

Figure 11:
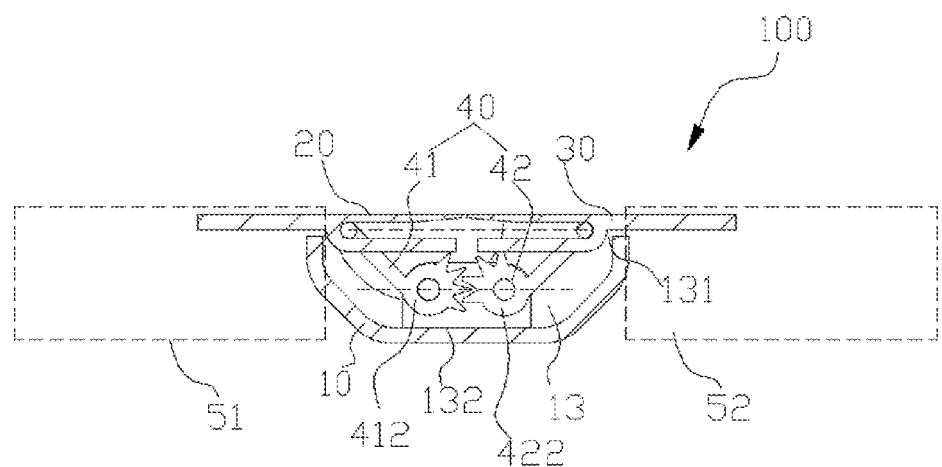
FIG. 11 is a schematic structural view illustrating a rotating shaft mechanism of an electronic device provided in other implementations of the present disclosure.
Figure 12:
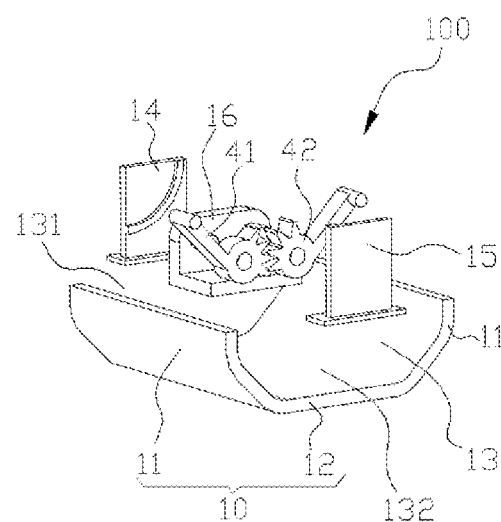
FIG. 12 is a schematic structural view illustrating a rotating shaft mechanism of an electronic device provided in other implementations of the present disclosure.

Referring to FIG. 11 and FIG. 12, furthermore, the rotating shaft base 10 defines an accommodating groove 13, the first rotating shaft 412 and the second rotating shaft 422 are each received in the accommodating groove 13, and a plane defined by the rotation axis-line of the first rotating member 20 and the rotation axis-line of the second rotating member 30 are located at a side of the first rotating shaft 412 and the second rotating shaft 422 away from bottom of the accommodating groove 13.

In this implementation, the accommodating groove 13 has an opening 131 and a bottom surface 132 opposite to the opening 131. The first rotating member 20 and the second rotating member 30 extend into the accommodating groove 13 through the opening 131. The first bracket 14, the second bracket 15, and the third bracket 16 are each fixed to the bottom surface 132. The first bracket 14 is rotatably connected with the first rotating member 20 and the second bracket 15 is rotatably connected with the second rotating member 30. The third bracket 16 is rotatably connected with the first rotating shaft 412 and the second rotating shaft 422. A plane defined by the rotation axis-line of the first rotating shaft 412 and the rotation axis-line of the second rotating shaft 422 is located between the bottom surface 132 and the plane defined by the rotation axis-line of the first rotating member 20 and the rotation axis-line of the second rotating member 30, where a distance between the plane defined by the rotation axis-line of the first rotating shaft 412 and the rotation axis-line of the second rotating shaft 422 and the bottom surface 132 is a first distance, a distance between the plane defined by the rotation axis-line of the first rotating member 20 and the rotation axis-line of the second rotating member 30 and the bottom surface 132 is a second distance, and the first distance is less than the second distance.

The rotation axis-line of the first rotating shaft 412 and the rotation axis-line of the first rotating member 20 are spaced apart in a direction which is perpendicular to the bottom surface 132, and the rotation axis-line of the second rotating shaft 422 and the rotation axis-line of the second rotating member 30 are spaced apart in a direction which is perpendicular to the bottom surface 132, where the rotation axis-line of the first rotating shaft 412 and the rotation axis-line of the second rotating shaft 422 are more adjacent to the bottom surface 132, the rotation axis-line of the first rotating member 20 and the rotation axis-line of second rotating member 30 are farther away from the bottom surface 132, such that the first rotating shaft 412 and the first rotating member 20 constitute a rotating shaft staggered structure with a height difference, and the second rotating shaft 422 and the second rotating member 30 constitute a rotating shaft staggered structure with a height difference. When the first main body 51 and the second main body 52 rotate relative to the rotating shaft base 10 respectively, the first rotating member 20 and the first linkage member 41 can cooperate with each other to meet rotation damping requirements at different angles, thereby realizing that the first main body 51 can hover at any angle, and ensuring that rotation damping of the first main body 51 changes smoothly during rotation; and the second rotating member 30 and the second linkage member 42 can cooperate with each other to meet rotation damping requirements at different angles, thereby realizing that the second main body 52 can hover at any angle, and ensuring that rotation damping of the second main body 52 changes smoothly during rotation.

Figure 13:
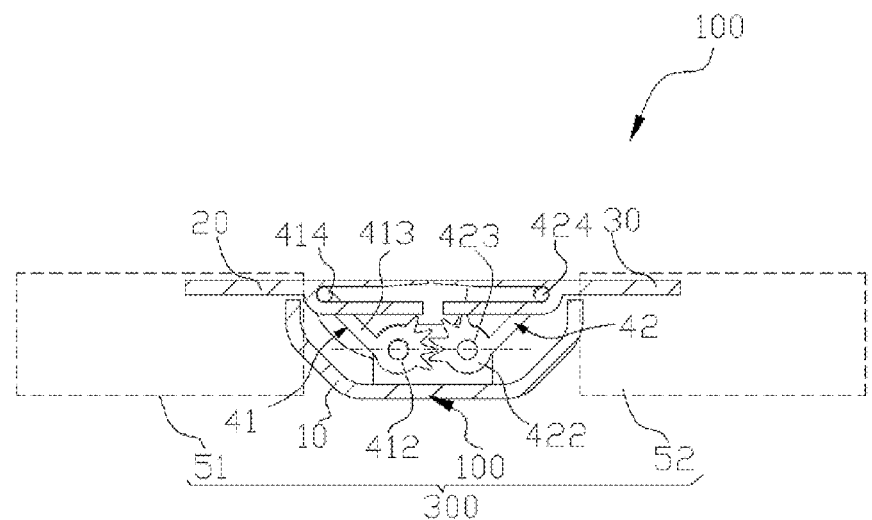
FIG. 13 is a schematic structural view illustrating a rotating shaft mechanism of an electronic device provided in other implementations of the present disclosure.

Referring to FIG. 13, furthermore, a distance between the rotation axis-line of the first rotating shaft 412 and the rotation axis-line of the second rotating shaft 422 is less than a distance between the rotation axis-line of the first rotating member 20 and the rotation axis-line of second rotating member 30. In this implementation, the first rotating shaft 412 and the second rotating shaft 422 are each micro rotating shafts, the size of the first rotating shaft 412 is less than that of the first rotating portion 21, the size of the second rotating shaft 422 is less than that of the second rotating portion 31, thereby realizing that the distance between the rotation axis-line of the first rotating shaft 412 and the rotation axis-line of the second rotating shaft 422 is less than the distance between the rotation axis-line of the first rotating member 20 and the rotation axis-line of the second rotating member 30, such that the first rotating shaft 412 and the second rotating shaft 422 occupy a smaller arrangement space than the first rotating portion 21 and the second rotating portion 31. However, the first push rod 413 and the second push rod 423 each have long-arm structures, are connected with back sides of the first baffle plate 22 and the second baffle plate 32, and occupy a small inner space of the rotating shaft base 10, such that the linkage assembly 40 has a small overall size and is suitable to be disposed in the rotating shaft base 10 with a small size, which is beneficial to realizing the small size of the rotating shaft mechanism. By driving the first rotating shaft 412 and the second rotating shaft 422 rotate synchronously through the long-arm shaped first push rod 413 and the long-arm shaped second push rod 423 respectively, synchronous rotating torques of the first rotating member 20 and the second rotating member 30 are kept at a smaller level; in addition, in this implementation, the first push rod 413 and the second push rod 423 can meet a requirement for a large-space transmission, there is no need to dispose a complicated multi-gear transmission structure, and the first push rod 413 and the second push rod 423 have simple structures and have a small accumulated lost motion error, which can meet a transmission requirement for high precision.

Referring to FIG. 13, furthermore, a direction in which the second sliding block 424 is opposite to the first sliding block 414 is parallel to the plane defined by the rotation axis-line of first rotating member 20 and the rotation axis-line of the second rotating member 30.

In this implementation, the first sliding block 414 and the second sliding block 424 are each cylindrical, and the first sliding block 414 is in rotating fit and sliding fit with the first sliding groove 223 of the first rotating member 20. The second sliding block 424 is in rotating fit and sliding fit with the second sliding groove 323 of the second rotating member 30. Since the length of the first push rod 413 is the same as the length of the second push rod 423, and an angle defined between the plane defined by the rotation axis-line of the first rotating shaft 412 and the rotation axis-line of the second rotating shaft 422 and the first push rod 413 is the same as an angle defined between the plane defined by the rotation axis-line of the first rotating shaft 412 and the rotation axis-line of the second rotating shaft 422 and the second push rod 423, it can be realized that the first push rod 413 and the second push rod 423 are arranged symmetrically, and the direction in which the second sliding block 424 is opposite to the first sliding block 414 is parallel to the plane defined by the rotation axis-line of the first rotating member 20 and the rotation axis-line of the second rotating member 30. Since the first linkage member 41 is linked with the second linkage member 42, the first sliding block 414 and the second sliding block 424 can rotate and slide relative to the first rotating member 20 and the second rotating member 30 respectively in synchronization, friction force of the first sliding block 414 relative to first rotating member 20 and friction force of the second sliding block 424 relative to the second rotating member 30 at least partially cancel each other out, thereby achieving that twisting forces of the first rotating member 20 and the second rotating member 30 are balanced during rotation. In other implementations, the first sliding block 414 and the second sliding block 424 may also be arranged in other shapes.

A sliding direction of the first sliding block 414 relative to the first rotating member 20 is perpendicular to a direction of the rotation axis-line the first rotating member 20. The first baffle plate 22 defines the first sliding groove 223, and the first baffle plate 22 is in rotating fit and sliding fit with the first sliding block 414 through the first sliding groove 223. The first sliding groove 223 extends from the first rotating end 221 of the first baffle plate 22 to the first connecting end 222, an extending direction of the first sliding groove 223 is perpendicular to the rotation axis-line of first rotating member 20. When the first baffle plate 22 and the second baffle plate 32 rotate relative to the rotating shaft base 10 apart from each other, the first sliding block 414 slides in a direction close to the first connecting end 222; and when the first baffle plate 22 and the second baffle plate 32 rotate relative to the rotating shaft base 10 close to each other, the first sliding block 414 slides in a direction close to the first rotating end 221. The first sliding block 414 slides back and forth in the first sliding groove 223, friction forces perpendicular to an axis-line direction can be generated on the first rotating member 20, which can meet rotation damping requirements of the first rotating member 20 at multiple angles, thereby ensuring a rotation hand feeling.

A sliding direction of the second sliding block 424 relative to the second rotating member 30 is perpendicular to a direction of the rotation axis-line the second rotating member 30. The second baffle plate 32 defines the second sliding groove 323, and the second baffle plate 32 is in rotating fit and sliding fit with the second sliding block 424 through the second sliding groove 323. The second sliding groove 323 extends from the second rotating end 321 of the second baffle plate 32 to the second connecting end 322, and an extending direction of the second sliding groove 323 is perpendicular to the rotation axis-line of the second rotating member 30. When the first baffle plate 22 and the second baffle plate 32 rotate relative to the rotating shaft base 10 apart from each other, the second sliding block 424 slides in a direction close to the second connecting end 322; and when the first baffle plate 22 and the second baffle plate 32 rotate relative to the rotating shaft base 10 close to each other, the second sliding block 424 slides in a direction close to the second rotating end 321. The second sliding block 424 slides back and forth in the second sliding groove 323, friction forces perpendicular to the axis-line direction can be generated on the second rotating member 30, which can meet rotation damping requirements of the second rotating member 30 at multiple angles, thereby ensuring the rotation hand feeling.

Figure 14:
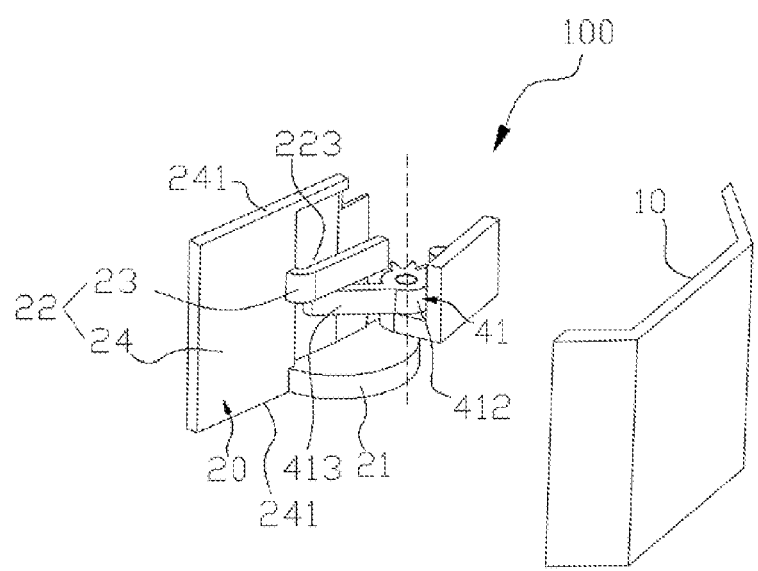
FIG. 14 is a schematic structural view illustrating a rotating shaft mechanism of an electronic device provided in other implementations of the present disclosure.

Referring to FIG. 14, furthermore, the first rotating member 20 has a first rotating portion 21, the first rotating portion 21 is rotatably connected with the rotating shaft base 10, the first rotating portion 21 and the first sliding portion 23 are arranged side by side in a direction of the rotation axis-line of the first linkage member 41, and the first linkage member 41 is at least partially overlapped with the first sliding portion 23 and is at least partially overlapped with the first rotating portion 21.

In this implementation, the first rotating member 20 further has a first main body portion 24 fixedly connected with the first rotating portion 21 and the first sliding portion 23. The first main body portion 24 is flat-plate shaped. The first main body portion 24 has two first side edges 241 opposite to each other. The two first side edges 241 are each substantially perpendicular to the direction of the rotation axis-line of the first linkage member 41. The first rotating portion 21 and the first sliding portion 23 are adjacent to the two first side edges 241 respectively. The rotation axis-line of the first rotating portion 21 is parallel to the rotation axis-line of the first linkage member 41. The first main body portion 24 and the first sliding portion 23 constitute the first baffle plate 22. The first sliding groove 223 is defined between the first sliding portion 23 and the first main body portion 24. The first sliding block 414 of the first linkage member 41 is in sliding fit with the first sliding groove 223.

The first push rod 413 is at least partially located between the first sliding portion 23 and the first rotating portion 21, or is located at a side of the first sliding portion 23 away from the first rotating portion 21, so as to achieve that the first linkage member 41 is at least partially overlapped with the first sliding portion 23 and at least partially overlapped with the first rotating portion 21, thereby preventing the first linkage member 41 from occupying a width dimension in the rotating shaft base 10, and providing an arrangement space for arranging the first rotating member 20 and the second rotating member 30.

Figure 15:
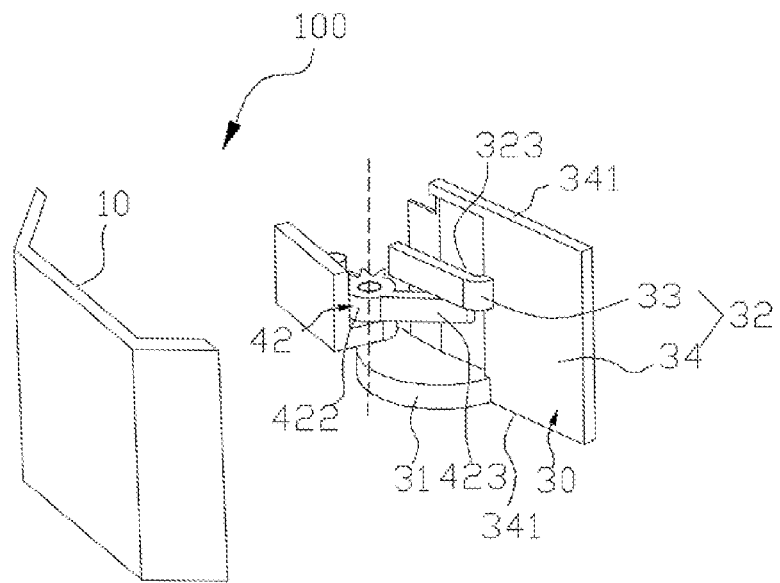
FIG. 15 is a schematic structural view illustrating a rotating shaft mechanism of an electronic device provided in other implementations of the present disclosure.

Referring to FIG. 15, furthermore, the second rotating member 30 has a second rotating portion 31, the second rotating portion 31 is rotatably connected with the rotating shaft base 10, the second rotating portion 31 and the second sliding portion 33 are arranged side by side in a direction of the rotation axis-line of the second linkage member 42, and the second linkage member 42 is at least partially overlapped with the second sliding portion 33 and at least partially overlapped with the second rotating portion 31.

In this implementation, the second rotating member 30 further has a second main body portion 34 fixedly connected with the second rotating portion 31 and the second sliding portion 33. The second main body portion 34 flat-plate shaped. The second main body portion 34 has two second side edges 341 opposite to each other. The two second side edges 341 are each substantially perpendicular to the direction of the rotation axis-line of the second linkage member 42. The second rotating portion 31 and the second sliding portion 33 are adjacent to two the second side edges 341 respectively. The rotation axis-line of the second rotating portion 31 is parallel to the rotation axis-line of the second linkage member 42. The second main body portion 34 and the second sliding portion 33 constitute the second baffle plate 32. The second sliding groove 323 is defined between the second sliding portion 33 and the second main body portion 34. The second sliding block 424 of the second linkage member 42 may be in sliding fit with the second sliding groove 323.

The second push rod 423 is at least partially located between the second sliding portion 33 and the second rotating portion 31, or is located at a side of the second sliding portion 33 away from the second rotating portion 31, so as to achieve that the second linkage member 42 is at least partially overlapped with the second sliding portion 33 and at least partially overlapped with the second rotating portion 31, thereby preventing the second linkage member 42 occupying an arrangement space of the second rotating member 30, thereby preventing the second linkage member 42 from occupying a width dimension in the rotating shaft base 10, and providing an arrangement space for arranging the first rotating member 20 and the second rotating member 30.

Figure 16:
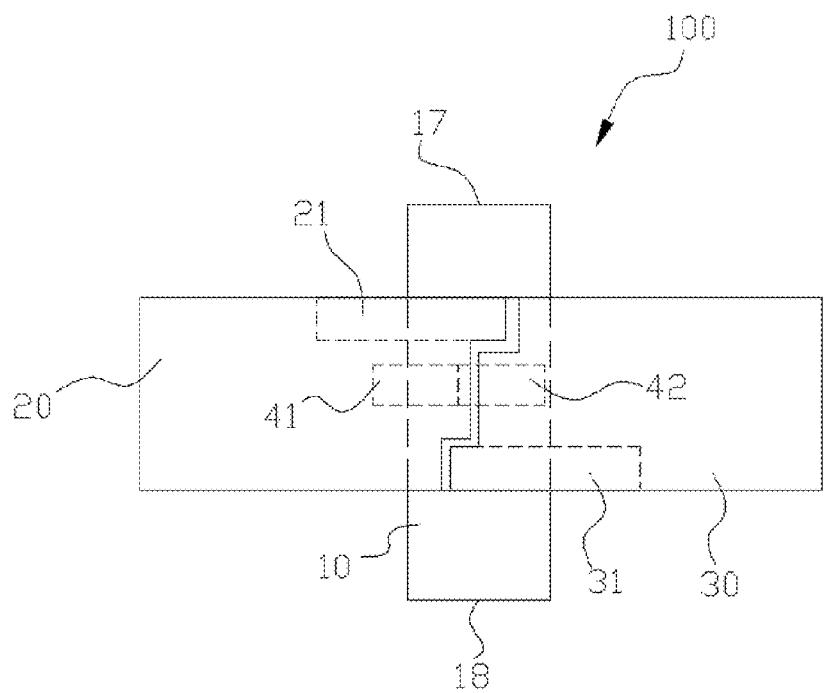
FIG. 16 is a schematic structural view illustrating a rotating shaft mechanism of an electronic device provided in other implementations of the present disclosure.
Figure 17:
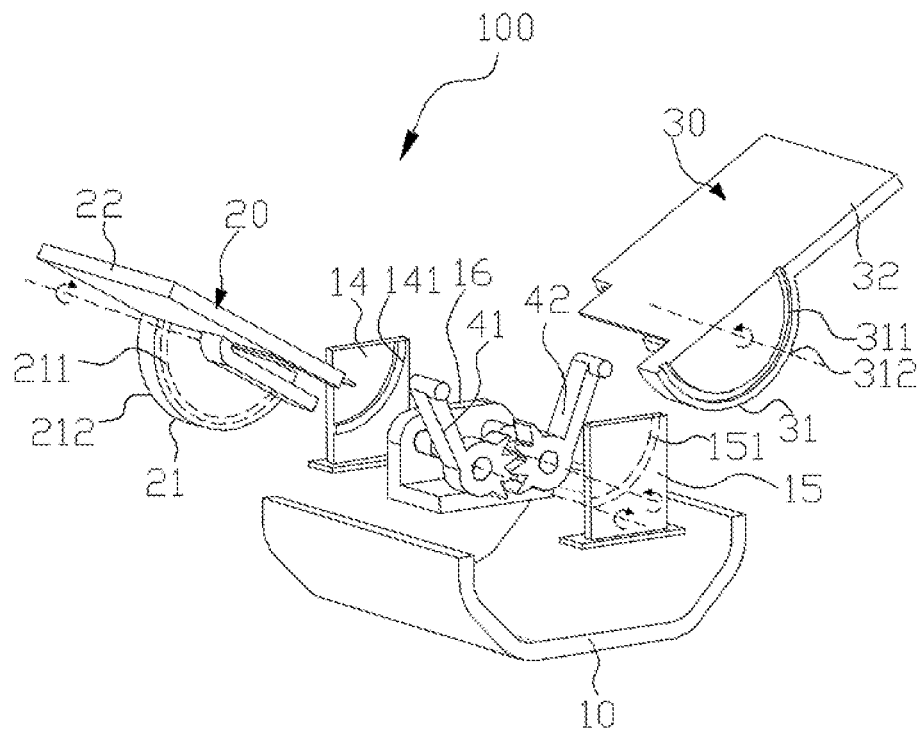
FIG. 17 is a schematic structural view illustrating a rotating shaft mechanism of an electronic device provided in other implementations of the present disclosure.

Referring to FIG. 16 and FIG. 17, furthermore, the rotating shaft base 10 has a first end 17 and a second end 18 opposite to the first end 17, the first rotating portion 21 is located at a side of the first linkage member 41 adjacent to the first end 17, the second rotating portion 31 is located at a side of the second linkage member 42 adjacent to the second end 18. When the first main body 51 and the second main body 52 are unfolded, the first rotating portion 21 is at least partially overlapped with the second rotating portion 31.

In this implementation, the rotating shaft base 10 is in a long strip shape. The first end 17 and the second end 18 respectively constitute two ends of the rotating shaft base 10, and a direction in which the first end 17 is opposite to the second end 18 is a length direction of the rotating shaft base 10. The first rotating portion 21 and the second rotating portion 31 are spaced apart in the length direction of the rotating shaft base 10. The first linkage member 41 and the second linkage member 42 are located between the first rotating portion 21 and the second rotating portion 31. The first linkage member 41 is at least partially overlapped with the first rotating portion 21, and the second linkage member 42 is at least partially overlapped with the second rotating portion 31. When the first main body 51 and the second main body 52 are unfolded, the first rotating portion 21 is at least partially overlapped with the second rotating portion 31, that is, the first rotating portion 21 and the second rotating portion 31 constitute a staggered structure, to reduce the distance between the rotation axis-line of first rotating portion 21 and the rotation axis-line of the second rotating portion 31 thus reducing occupation of the arrangement space of the rotating shaft base 10. In addition, the first linkage member 41 and the second linkage member 42 is located in a space between the first rotating portion 21 and the second rotating portion 31, so that there is no need to increase a width dimension of the rotating shaft base 10 to provide an arrangement space, which is beneficial to realizing the miniaturization of the rotating shaft mechanism.

Referring to FIG. 16 and FIG. 17, furthermore, the first rotating portion 21 has a first connecting structure 211 extending in an arc, the first rotating portion 21 is rotatably connected with the rotating shaft base 10 through the first connecting structure 211, the second rotating portion 31 has a second connecting structure 311 extending in an arc, the second rotating portion 31 is rotatably connected with the rotating shaft base 10 through the second connecting structure 311, and a distance between the rotation axis-line of the first rotating portion 21 and the rotation axis-line of the second rotating portion 31 is less than a sum of a radius of the first connecting structure 211 and a radius of the second connecting structure 311.

In this implementation, the first rotating portion 21 is semicircular-plate shaped. The first rotating portion 21 has a first arc-shaped edge 212. The first arc-shaped edge 212 is in a semicircle. The first connecting structure 211 extends in a direction parallel to the first arc-shaped edge 212. The first connecting structure 211 may be an arc-shaped groove, the first bracket 14 has a first protruding structure 141, the first protruding structure 141 is also an arc-shaped structure, the first protruding structure 141 is in sliding fit with the first connecting structure 211, and then the first connecting structure 211 can slide along an arc relative to the first protruding structure 141, so that the first rotating portion 21 can rotate relative to the first bracket 14 and the rotation axis-line of the first rotating portion 21 coincides with the center of the first connecting structure 211. The first connecting structure 211 and the first protruding structure 141 each have relatively great radiuses, which makes a rotating fit area of the first rotating portion 21 and the first bracket 14 relatively great, which is beneficial to ensuring that the first rotating portion 21 rotates stably relative to the first bracket 14 and ensuring the strength of a rotating shaft. In other implementations, the first rotating portion 21 may be in other shapes, which is not limited herein. The first connecting structure 211 may be a protruding structure, correspondingly, the first bracket 14 may define a groove structure in rotating fit with the first connecting structure 211.

The second rotating portion 31 is semicircular-plate shaped. The second rotating portion 31 has a second arc-shaped edge 312. The second arc-shaped edge 312 in a semicircle. The second connecting structure 311 extends in a direction parallel to the second arc-shaped edge 312. The second connecting structure 311 may be an arc-shaped groove, the second bracket 15 has a second protruding structure 151, the second protruding structure 151 is also an arc-shaped structure, the second protruding structure 151 is in sliding fit with the second connecting structure 311, and then the second connecting structure 311 can slide along an arc relative to the second protruding structure 151, so that the second rotating portion 31 can rotate relative to the second bracket 15 and the rotation axis-line of the second rotating portion 31 coincides with the center of the second connecting structure 311. The second connecting structure 311 and the second protruding structure 151 each have relatively great radiuses, which makes a rotating fit area of the second rotating portion 31 and the second bracket 15 relatively great, which is beneficial to ensuring that the second rotating portion 31 rotates stably relative to the second bracket 15 and ensuring the strength of a rotating shaft. In other implementations, the second rotating portion 31 may be in other shapes, which is not limited herein. The second connecting structure 311 may be a protruding structure, correspondingly, the second bracket 15 may define a groove structure in rotating fit with the second connecting structure 311.

Radiuses of the first rotating portion 21 and the second rotating portion 31 are relatively great, in order to save a width dimension of the rotating shaft base 10 occupied by the first rotating portion 21 and the second rotating portion 31, the first rotating portion 21 and the second rotating portion 31 are disposed in the rotating shaft base 10 spaced apart from each other and the rotation axis-line of the first rotating portion 21 and the rotation axis-line of second rotating portion 31 are each parallel to a length direction of the rotating shaft base 10, which makes rotating movement of the first rotating portion 21 and rotating movement of the second rotating portion 31 not interfere with each other. In addition, since the distance between the rotation axis-line of the first rotating portion 21 and the rotation axis-line of the second rotating portion 31 is less than the sum of the radius the first connecting structure 211 and the radius of the second connecting structure 311, the distance between the rotation axis-line of the first rotating portion 21 and the rotation axis-line of the second rotating portion 31 can be further reduced, which, on one hand, is beneficial to saving arrangement space and reducing a width dimension of the rotating shaft base 10, and on the other hand can reduce the distance between the rotation axis-line of the first rotating portion 21 and the rotation axis-line of the first linkage member 41 and the distance between the rotation axis-line of the second rotating portion 31 and the rotation axis-line of the second linkage member 42, which are beneficial to reducing rotating torques and improving user experience.

Figure 18:
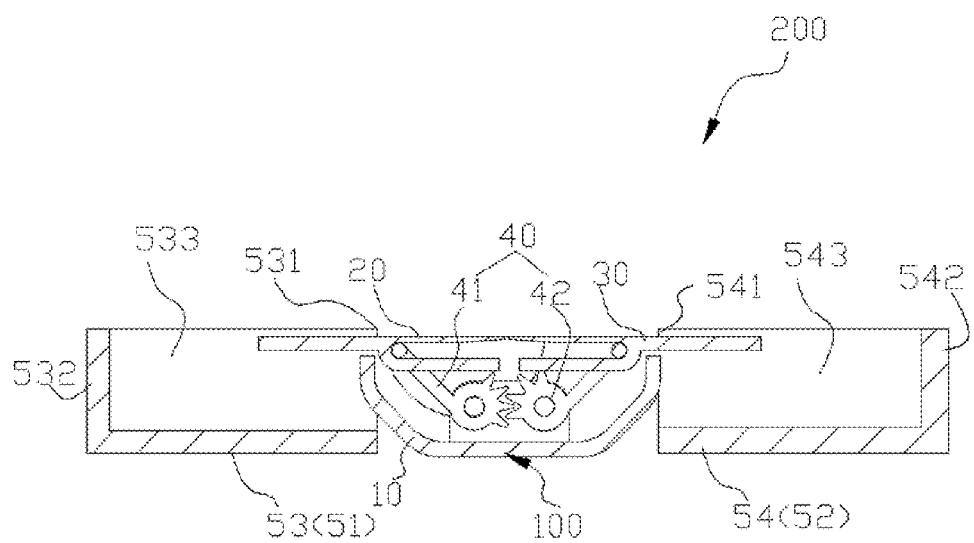
FIG. 18 is a schematic structural view illustrating a foldable assembly of an electronic device provided in implementations of the present disclosure.

Referring to FIG. 18, a foldable assembly 200 is also provided in implementations of the present disclosure, the foldable assembly 200 includes a first housing 53, a second housing 54, and a rotating shaft mechanism 100.

Reference of the rotating shaft mechanism 100 can be made to forgoing descriptions, which is not repeated herein. The first housing 53 constitutes the first main body 51. The second housing 54 constitutes the second main body 52.

Figure 19:
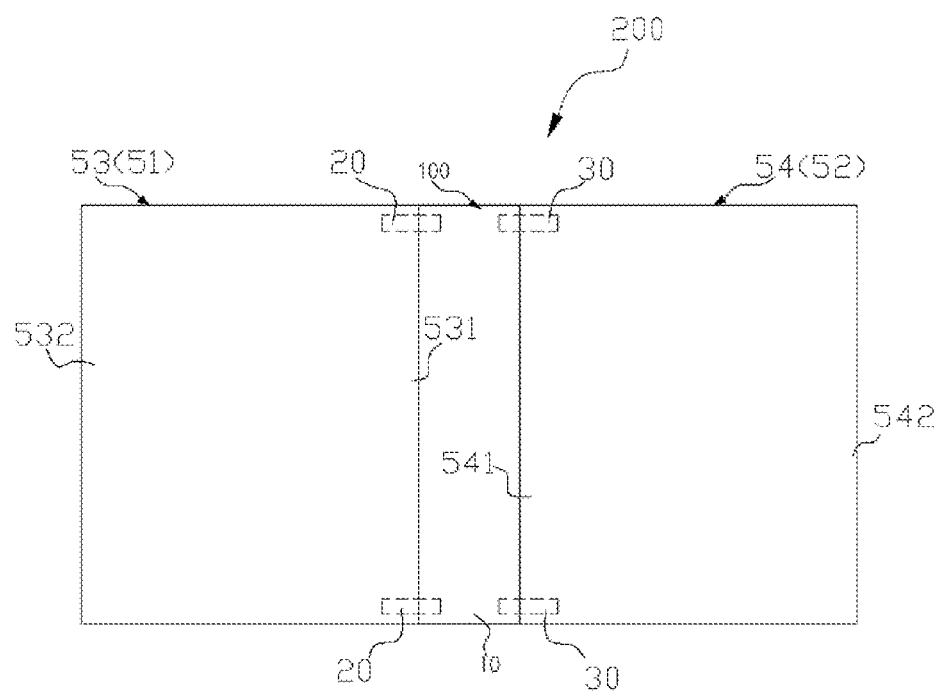
FIG. 19 is a schematic structural view illustrating a foldable assembly of an electronic device provided in other implementations of the present disclosure.

Referring to FIG. 18 and FIG. 19, the first housing 53 is substantially rectangular. The first housing 53 has a first connecting edge 531 and a first free edge 532 opposite to the first connecting edge 531. The first connecting edge 531 is located at a side of the first housing 53 adjacent to the rotating shaft base 10, and the first free edge 532 is located at a side of the first housing 53 away from the rotating shaft base 10. The second housing 54 is substantially rectangular. The second housing 54 has a second connecting edge 541 and a second free edge 542 opposite to the second connecting edge 541. The second connecting edge 541 is located at a side of the second housing 54 adjacent to the rotating shaft base 10, and the second free edge 542 is located at a side of the second housing 54 away from the rotating shaft base 10.

The rotating shaft mechanism 100 may include two first rotating members 20 opposite to each other and two second rotating members 30 opposite to each other. Each of the two first rotating member 20 is connected with the first housing 53 and the rotating shaft base 10, and each of the two the second rotating member 30 is connected with the second housing 54 and the rotating shaft base 10. The rotating shaft base 10 is in a long strip shape. The two first rotating member 20 are rotatably connected with two ends of the rotating shaft base 10 respectively, and ends of the two first rotating member 20 away from the rotating shaft base 10 are connected with the first connecting edge 531. The two second rotating member 30 are rotatably connected with two ends of the rotating shaft base 10 respectively, and ends of the two second rotating member 30 away from the rotating shaft base 10 are connected with the second connecting edge 541. In other implementations, the number of each of the first rotating member 20 and the second rotating member 30 may be greater than 2.

The first housing 53 and the second housing 54 are configured to be fixedly connected with and to support a flexible display screen 60, to drive the flexible display screen 60 to fold or unfold, thereby realizing two states of use. The first housing 53 defines a first accommodating space 533 between the first connecting edge 531 and the first free edge 532. The second housing 54 defines a second accommodating space 543 between the second connecting edge 541 and the second free edge 542. The first accommodating space 533 and the second accommodating space 543 can be configured to accommodate a functional device. The functional device may be a circuit board, a camera module, a speaker module, or a receiver module, etc.

Figure 20:
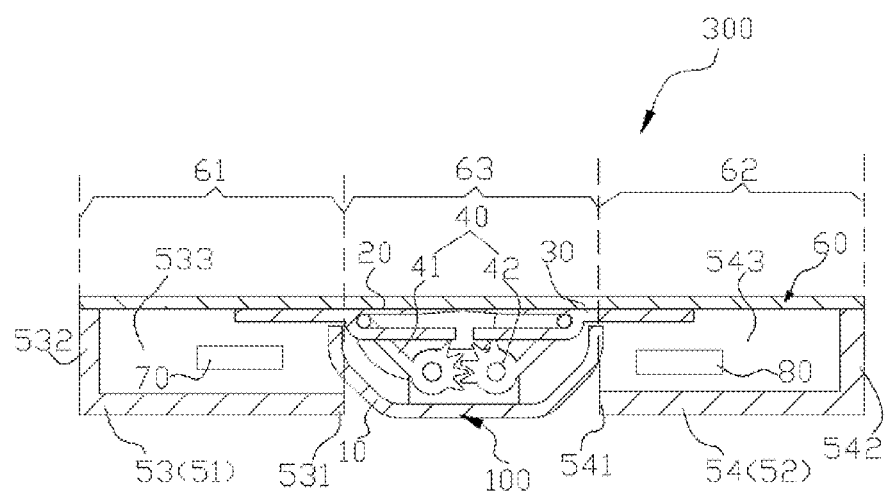
FIG. 20 is a schematic structural view illustrating an electronic device provided in implementations of the present disclosure.

Referring to FIG. 20, an electronic device 300 is further provided in implementations of the present disclosure. The electronic device 300 includes the above foldable assembly 200. It can be understood that, the electronic device 300 may be a smart phone, a smart watch, a tablet computer, a notebook computer, or a wearable device, etc.

Figure 21:
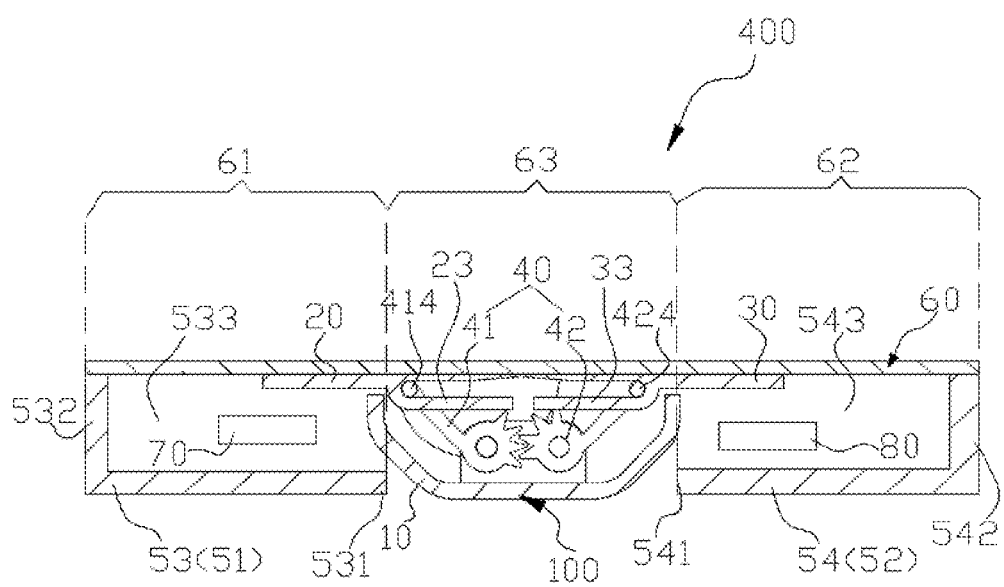
FIG. 21 is a schematic structural view illustrating an electronic device provided in other implementations of the present disclosure.

Referring to FIG. 21, an electronic device 400 is further provided in implementations of the present disclosure, the electronic device 400 includes a first housing 53, a second housing 54, a rotating shaft mechanism 100, and a flexible display screen 60. Reference of the rotating shaft mechanism 100 can be made to forgoing implementations, which will not be repeated herein. The flexible display screen 60 includes a first display portion 61, a second display portion 62 opposite to the first display portion 61, and a bendable display portion 63 fixedly connected with the first display portion 61 and the second display portion 62. The first display portion 61 is fixed to the first housing 53, the second display portion 62 is fixed to the second housing 54, and the first housing 53 is configured to rotate relative to the second housing 54 through the rotating shaft mechanism 100 to drive the bendable display portion 63 to bend.

The first display portion 61 is fixed between the first connecting edge 531 and the first free edge 532. The first display portion 61 is configured to cover the first accommodating space 533 of the first housing 53. The second display portion 62 is fixed between the second connecting edge 541 and the second free edge 542, and the second display portion 62 is configured to cover the second accommodating space 543 of the second housing 54. The bendable display portion 63 is fixed between the first display portion 61 and the second display portion 62, and the bendable display portion 63 is arranged opposite to the rotating shaft base 10. The first housing 53 can synchronously rotate with the second housing 54 relative to the rotating shaft base 10 through the rotating shaft base 10, to drive the first display portion 61 to unfold or fold relative to the second display portion 62 and drive the bendable display portion 63 to unfold or bend. The rotating shaft mechanism 100 ensures that rotating movements of both sides of the flexible display screen 60 are synchronous, so as to ensure that the bendable display portion 63 of the flexible display screen 60 is subjected to uniform force, avoiding an influence on the service life by local stress concentration on the bendable display portion 73.

The electronic device 400 further includes a first functional component 70 and a second functional component 80.

The first functional component 70 is fixed in the first accommodating space 533. The second functional component 80 is fixed in the second accommodating space 543. The first functional component 70 may include a circuit board, a camera module, a speaker module, or a receiver module, etc. The second functional component 80 may include a circuit board, a camera module, a speaker module, or a receiver module, etc.

In the electronic device provided in implementations of the present disclosure, the first linkage member and the second linkage member are each rotatably connected with the rotating shaft base, the first rotating member has the first sliding portion in sliding fit with the first sliding block, the second rotating member has the second sliding portion in sliding fit with the second sliding block, the first rotating member can rotate synchronously with the second rotating member through the linkage assembly, that is, the first linkage member is linked with the second linkage member, the first rotating member can transmit twisting force to the second rotating member through the first linkage member and the second linkage member, and vice versa, the second rotating member can also transmit twisting force the first rotating member through the first linkage member and the second linkage member, thereby achieving synchronous rotation of the first rotating member and the second rotating member and avoiding adopting a complex gear structure, which can reduce assembly errors, improve transmission accuracy, and reduce product costs.

In summary, although the present disclosure has been disclosed as above with some implementations, these implementations are not intended to limit the present disclosure. Those of ordinary skill in the art can make various changes and embellishments without departing from a spirit and scope of the present disclosure, therefore the protection scope of the present disclosure should be subject to the scope defined by the claims.

What is claimed is:

1. An electronic device comprising a first main body, a second main body, and a rotating shaft mechanism, wherein
the rotating shaft mechanism comprises a rotating shaft base, a first rotating member, a second rotating member, and a linkage assembly, and the first rotating member is connected with the first main body and the second rotating member is connected with the second main body;
the linkage assembly comprises a first linkage member and a second linkage member, the first linkage member and the second linkage member are each rotatably connected with the rotating shaft base, the first linkage member has a first sliding block, the second linkage member has a second sliding block, the first rotating member has a first sliding portion in sliding fit with the first sliding block, the second rotating member has a second sliding portion in sliding fit with the second sliding block; wherein the first rotating member further has a first main body portion fixedly connected with the first sliding portion, the first sliding portion is disposed at one side of the first main body portion, a first sliding groove is defined between the first sliding portion and the first main body portion, and the first sliding block is in sliding fit and rotating fit with the first sliding groove;
the first rotating member has a first rotating portion, the first rotating portion is rotatably connected with the rotating shaft base, the first rotating portion and the first sliding portion are arranged side by side in a direction of a rotation axis-line of the first linkage member, an orthographic projection of the first linkage member on a plane where the first rotating portion is located at least partially falls into the first rotating portion, and an orthographic projection of the first sliding portion on the plane where the first rotating portion is located at least partially falls into the first rotating portion; and
the second rotating member has a second rotating portion, the second rotating portion is rotatably connected with the rotating shaft base, the second rotating portion and the second sliding portion are arranged side by side in a direction of a rotation axis-line of the second linkage member, an orthographic projection of the second linkage member on a plane where the second rotating portion is located at least partially falls into the second rotating portion, and an orthographic projection of the second sliding portion on the plane where the second rotating portion is located at least partially falls into the second rotating portion.

2. The electronic device of claim 1, wherein the first linkage member has a first rotating shaft and a first push rod fixedly connected with the first rotating shaft, the first rotating shaft is rotatably connected with the rotating shaft base, a rotation axis-line of the first rotating shaft is parallel to a rotation axis-line of the first rotating member, and the first sliding block is disposed at an end of the first push rod away from the first rotating shaft; and
wherein the second linkage member has a second rotating shaft and a second push rod fixedly connected with the second rotating shaft, the second rotating shaft is rotatably connected with the rotating shaft base, a rotation axis-line of the second rotating shaft is parallel to a rotation axis-line of the second rotating member, the second rotating shaft and the first rotating shaft are linked with each other, and the second sliding block is disposed at an end of the second push rod away from the second rotating shaft.

3. The electronic device of claim 2, wherein the rotating shaft base defines an accommodating groove, the first rotating shaft and the second rotating shaft are each received in the accommodating groove, and a plane defined by the rotation axis-line of the first rotating member and the rotation axis-line of second rotating member is located at a side of the first rotating shaft and the second rotating shaft away from bottom of the accommodating groove.

4. The electronic device of claim 3, wherein the accommodating groove has an opening and a bottom surface opposite to the opening; and a distance between a plane defined by the rotation axis-line of the first rotating shaft and the rotation axis-line of the second rotating shaft and the bottom surface is a first distance, a distance between a plane defined by the rotation axis-line of the first rotating member and the rotation axis-line of the second rotating member and the bottom surface is a second distance, and the first distance is less than the second distance.

5. The electronic device of claim 2, wherein a distance between the rotation axis- line of the first rotating shaft and the rotation axis-line of the second rotating shaft is less than a distance between the rotation axis-line of the first rotating member and the rotation axis-line of the second rotating member.

6. The electronic device of claim 1, wherein a direction in which the second sliding block is opposite to the first sliding block is parallel to a plane defined by a rotation axis-line of the first rotating member and a rotation axis-line of the second rotating member.

7. The electronic device of claim 6, wherein a sliding direction of the first sliding block relative to the first rotating member is perpendicular to a direction of the rotation axis-line of the first rotating member.

8. The electronic device of claim 7, wherein the first rotating member has a first rotating portion fixedly connected with the first main body portion.

9. The electronic device of claim 8, wherein the first main body portion has a first rotating end and a first connecting end opposite to the first rotating end, the first rotating portion is disposed at the first rotating end, and in a direction perpendicular to the sliding direction of the first sliding block relative to the first rotating member, the size of the first sliding groove close to the first rotating end is greater than that of the first sliding groove close to the first connecting end.

10. The electronic device of claim 1, wherein the rotating shaft base has a first end and a second end opposite to the first end, the first rotating portion is located at a side of the first linkage member adjacent to the first end, the second rotating portion is located at a side of the second linkage member adjacent to the second end, and the first rotating portion is at least partially overlapped with the second rotating portion when the first main body and the second main body are unfolded.

11. The electronic device of claim 10, wherein the first rotating portion has a first connecting structure extending in an arc, the first rotating portion is rotatably connected with the rotating shaft base through the first connecting structure, the second rotating portion has a second connecting structure extending in an arc, the second rotating portion is rotatably connected with the rotating shaft base through the second connecting structure, and a distance between a rotation axis-line of the first rotating portion and a rotation axis-line of the second rotating portion is less than a sum of a radius of the first connecting structure and a radius of the second connecting structure.

12. An electronic device comprising a first housing, a second housing, a rotating shaft mechanism, and a flexible display screen; wherein
the rotating shaft mechanism comprises a rotating shaft base, a first rotating member, a second rotating member, and a linkage assembly, and the first rotating member is connected with the first housing and the second rotating member is connected with the second housing;
the linkage assembly comprises a first linkage member and a second linkage member, the first linkage member and the second linkage member are each rotatably connected with the rotating shaft base, the first linkage member has a first sliding block, the second linkage member has a second sliding block, the first rotating member has a first sliding portion in sliding fit with the first sliding block, the second rotating member has a second sliding portion in sliding fit with the second sliding block; the first rotating member further has a first main body portion connected with the first sliding portion, the first sliding portion is disposed at one side of the first main body portion, and the first sliding portion is rotatably and slidingly connected with the first sliding block;
the flexible display screen has a first display portion, a second display portion arranged opposite to the first display portion, and a bendable display portion fixedly connected with the first display portion and the second display portion, the first display portion is fixed to the first housing, the second display portion is fixed to the second housing, and the first housing is configured to rotate relative to the second housing through the rotating shaft mechanism to drive the bendable display portion to bend;
the first rotating member has a first rotating portion, the first rotating portion is rotatably connected with the rotating shaft base, the first rotating portion and the first sliding portion are arranged side by side in a direction of a rotation axis-line of the first linkage member, an orthographic projection of the first linkage member on a plane where the first rotating portion is located at least partially falls into the first rotating portion, and an orthographic projection of the first sliding portion on the plane where the first rotating portion is located at least partially falls into the first rotating portion; and
the second rotating member has a second rotating portion, the second rotating portion is rotatably connected with the rotating shaft base, the second rotating portion and the second sliding portion are arranged side by side in a direction of a rotation axis-line of the second linkage member, an orthographic projection of the second linkage member on a plane where the second rotating portion is located at least partially falls into the second rotating portion, and an orthographic projection of the second sliding portion on the plane where the second rotating portion is located at least partially falls into the second rotating portion.

13. The electronic device of claim 12, wherein the first linkage member has a first rotating shaft and a first push rod fixedly connected with the first rotating shaft, the first rotating shaft is rotatably connected with the rotating shaft base, a rotation axis-line of the first rotating shaft is parallel to a rotation axis-line of the first rotating member, and the first sliding block is disposed at an end of the first push rod away from the first rotating shaft;
wherein the second linkage member has a second rotating shaft and a second push rod fixedly connected with the second rotating shaft, the second rotating shaft is rotatably connected with the rotating shaft base, a rotation axis-line of the second rotating shaft is parallel to a rotation axis-line of the second rotating member, the second rotating shaft and the first rotating shaft are linked with each other, and the second sliding block is disposed at an end of the second push rod away from the second rotating shaft.

14. The electronic device of claim 12, wherein the first rotating member further has a first rotating portion, the first main body portion and the first sliding portion constitutes a first baffle plate, and the first baffle plate is fixedly connected with the first rotating portion; and
the first baffle plate defines a first sliding groove, the first baffle plate is in rotating fit and sliding fit with the first sliding block through the first sliding groove.

15. The electronic device of claim 14, wherein the first main body portion has a first rotating end and a first connecting end opposite to the first rotating end, the first rotating end is close to the rotating shaft base relative to the first connecting end, and in a direction perpendicular to a plane defined by a rotation axis-line of the first rotating member and a rotation axis-line of the second rotating member, an opening size of the first sliding groove close to the first rotating end is greater than that of the first sliding groove close to the first connecting end.

16. A foldable assembly comprising a first housing, a second housing, and a rotating shaft mechanism; wherein
the rotating shaft mechanism comprises a rotating shaft base, a first rotating member, a second rotating member, and a linkage assembly, and the first rotating member is connected with the first housing and the second rotating member is connected with the second housing; and the linkage assembly comprises a first linkage member and a second linkage member, the first linkage member and the second linkage member are each rotatably connected with the rotating shaft base, the first linkage member has a first sliding block, the second linkage member has a second sliding block, the first rotating member has a first sliding portion in sliding fit with the first sliding block, the second rotating member has a second sliding portion in sliding fit with the second sliding block; wherein the first rotating member further has a first main body portion fixedly connected with the first sliding portion, the first sliding portion is disposed at one side of the first main body portion, a first sliding groove is defined between the first sliding portion and the first main body portion, and the first sliding block is in sliding fit and rotating fit with the first sliding groove;

the first rotating member has a first rotating portion, the first rotating portion is rotatably connected with the rotating shaft base, the first rotating portion and the first sliding portion are arranged side by side in a direction of a rotation axis-line of the first linkage member, an orthographic projection of the first linkage member on a plane where the first rotating portion is located at least partially falls into the first rotating portion, and an orthographic projection of the first sliding portion on the plane where the first rotating portion is located at least partially falls into the first rotating portion; and the second rotating member has a second rotating portion, the second rotating portion is rotatably connected with the rotating shaft base, the second rotating portion and the second sliding portion are arranged side by side in a direction of a rotation axis-line of the second linkage member, an orthographic projection of the second linkage member on a plane where the second rotating portion is located at least partially falls into the second rotating portion, and an orthographic projection of the second sliding portion on the plane where the second rotating portion is located at least partially falls into the second rotating portion.

\* \* \* \* \*